United States Patent
Yamazaki et al.

(10) Patent No.: US 6,776,847 B2
(45) Date of Patent: Aug. 17, 2004

(54) FILM FORMATION APPARATUS AND FILM FORMATION METHOD AND CLEANING METHOD

(75) Inventors: Shunpei Yamazaki, Tokyo (JP); Masakazu Murakami, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/318,793

(22) Filed: Dec. 12, 2002

(65) Prior Publication Data

US 2003/0124764 A1 Jul. 3, 2003

(30) Foreign Application Priority Data

Dec. 12, 2001 (JP) .......................................... 2001-379273
Feb. 22, 2002 (JP) .......................................... 2002-046967

(51) Int. Cl.$^7$ ................................................ C23C 16/00
(52) U.S. Cl. ..................... 118/724; 118/722; 118/726; 118/719; 438/99; 438/780
(58) Field of Search ................................ 118/719, 722, 118/724, 726; 438/99, 780

(56) References Cited

U.S. PATENT DOCUMENTS

| | | | |
|---|---|---|---|
| 5,039,561 A | | 8/1991 | Debe |
| 5,501,739 A | * | 3/1996 | Yamada et al. ............. 118/719 |
| 5,817,578 A | | 10/1998 | Ogawa |
| 5,863,338 A | * | 1/1999 | Yamada et al. ............. 118/719 |
| 6,106,627 A | * | 8/2000 | Yializis ..................... 118/724 |
| 6,179,923 B1 | | 1/2001 | Yamamoto et al. |
| 6,294,025 B1 | * | 9/2001 | Kinder ........................ 118/641 |
| 2001/0006827 A1 | | 7/2001 | Yamazaki et al. |
| 2002/0011205 A1 | | 1/2002 | Yamazaki et al. |

FOREIGN PATENT DOCUMENTS

| | | |
|---|---|---|
| EP | 0 987 700 | 3/2000 |
| JP | 61-030661 | 2/1986 |
| JP | 04-236759 | 8/1992 |
| JP | 07-062526 | 3/1995 |
| JP | 08-319586 | 12/1996 |
| JP | 10-168559 | 6/1998 |
| JP | 10-294181 | 11/1998 |
| JP | 2000-282219 | 10/2000 |
| JP | 2000-328229 | 11/2000 |
| JP | 2001-149877 | 6/2001 |
| JP | 2001-247959 | 9/2001 |
| JP | 2001-523768 | 11/2001 |
| JP | 2002-060926 | 2/2002 |
| WO | WO 99/25894 | 5/1999 |

OTHER PUBLICATIONS

Japan 2001–247959: English Abstract; DIALOG(R) File 347:JAPIO (2004), Accession No. 07020327 and family to U.S. Publication No. 2001/0006827 A1 (Desig. ID "AA").
Japan 2001–523768: English Abstract; DIALOG(R) File 352:Derwent WPI (2004), Accession No. 012564660 and family to WO 99/25894 (Desig. ID "AP").
Japan 2002–060926: English Abstract; DIALOG(R) File 347:JAPIO (2003), Accession No. 07192526 and family to U.S. Publication No. 2002/0011205 A1 (Desig. ID "AB").

* cited by examiner

Primary Examiner—Alexander Ghyka
(74) Attorney, Agent, or Firm—Fish & Richardson P.C.

(57) ABSTRACT

The purpose of the invention is to provide a film formation apparatus capable of forming an EL layer with a high purity and a high density, and a cleaning method. The invention is a formation of an EL layer with a high density by heating a substrate 10 by a heating means for heating a substrate, decreasing the pressure of a film formation chamber with a pressure decreasing means (a vacuum pump such as a turbo-molecular pump, a dry pump, or a cryopump) connected to the film formation chamber to $5\times10^{-3}$ Torr (0.665 Pa) or lower, preferably $1\times10^{-3}$ Torr (0.133 Pa) or lower, and carrying out film formation by depositing organic compound materials from deposition sources. In the film formation chamber, cleaning of deposition masks is carried out by plasma.

27 Claims, 15 Drawing Sheets

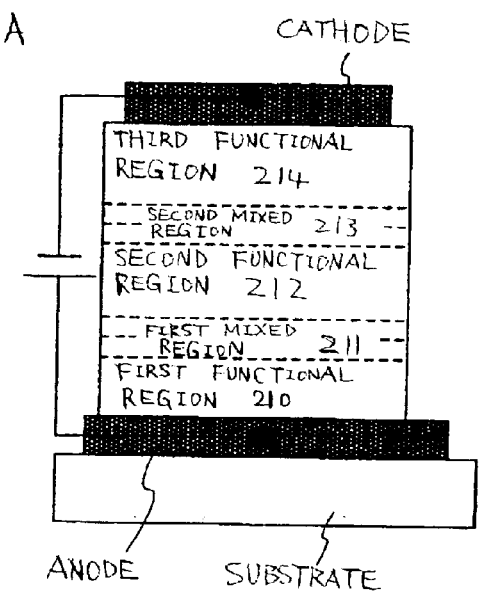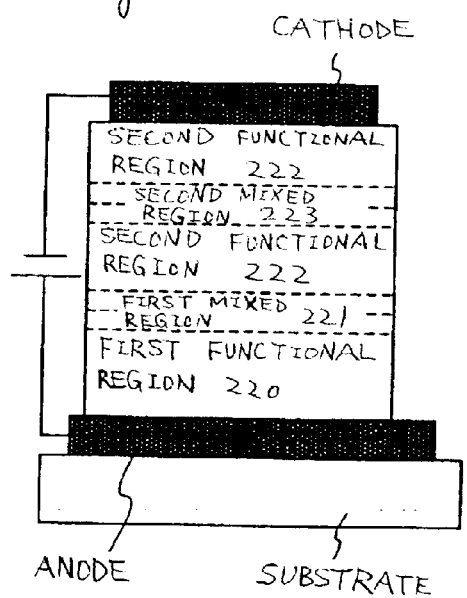

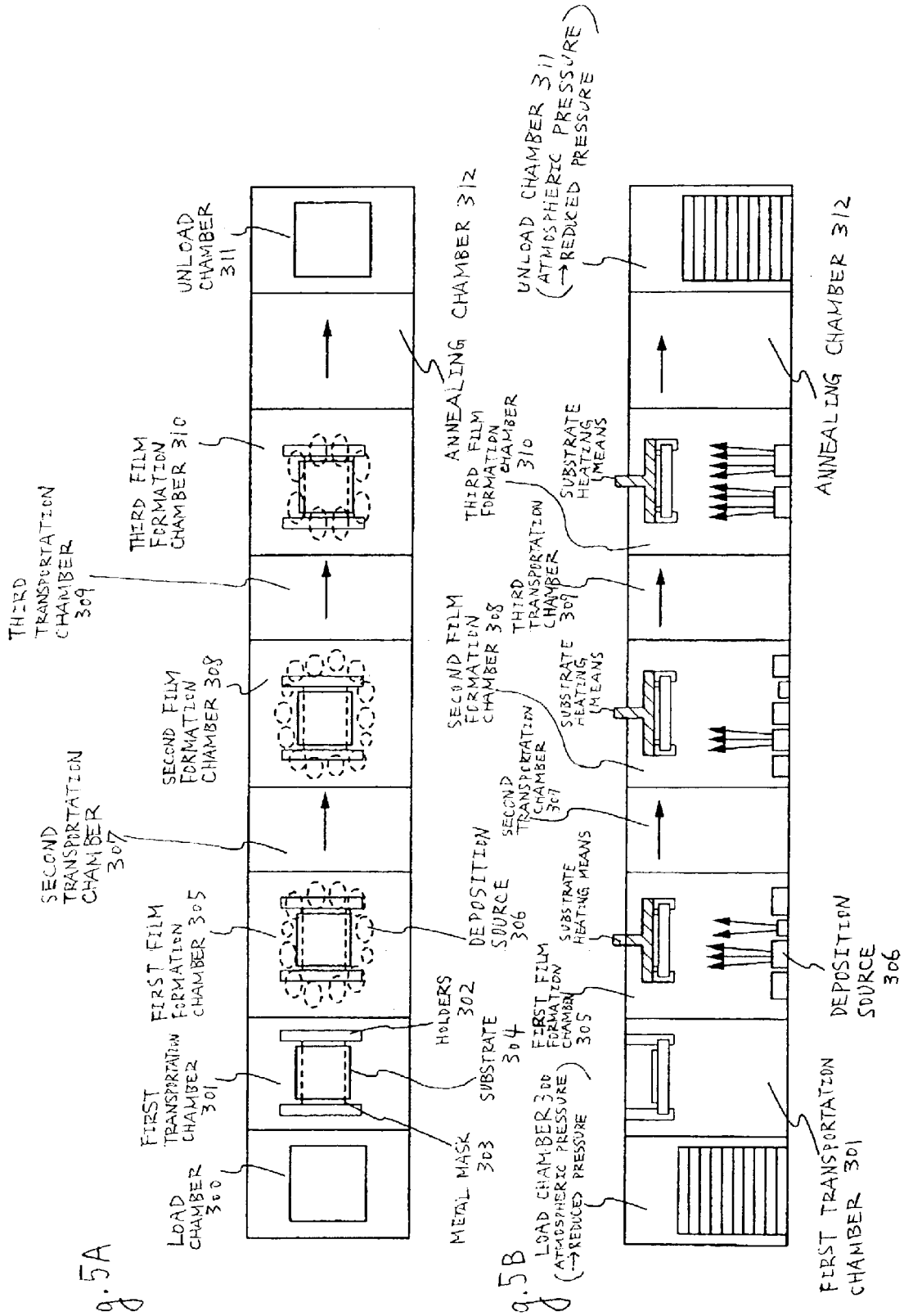

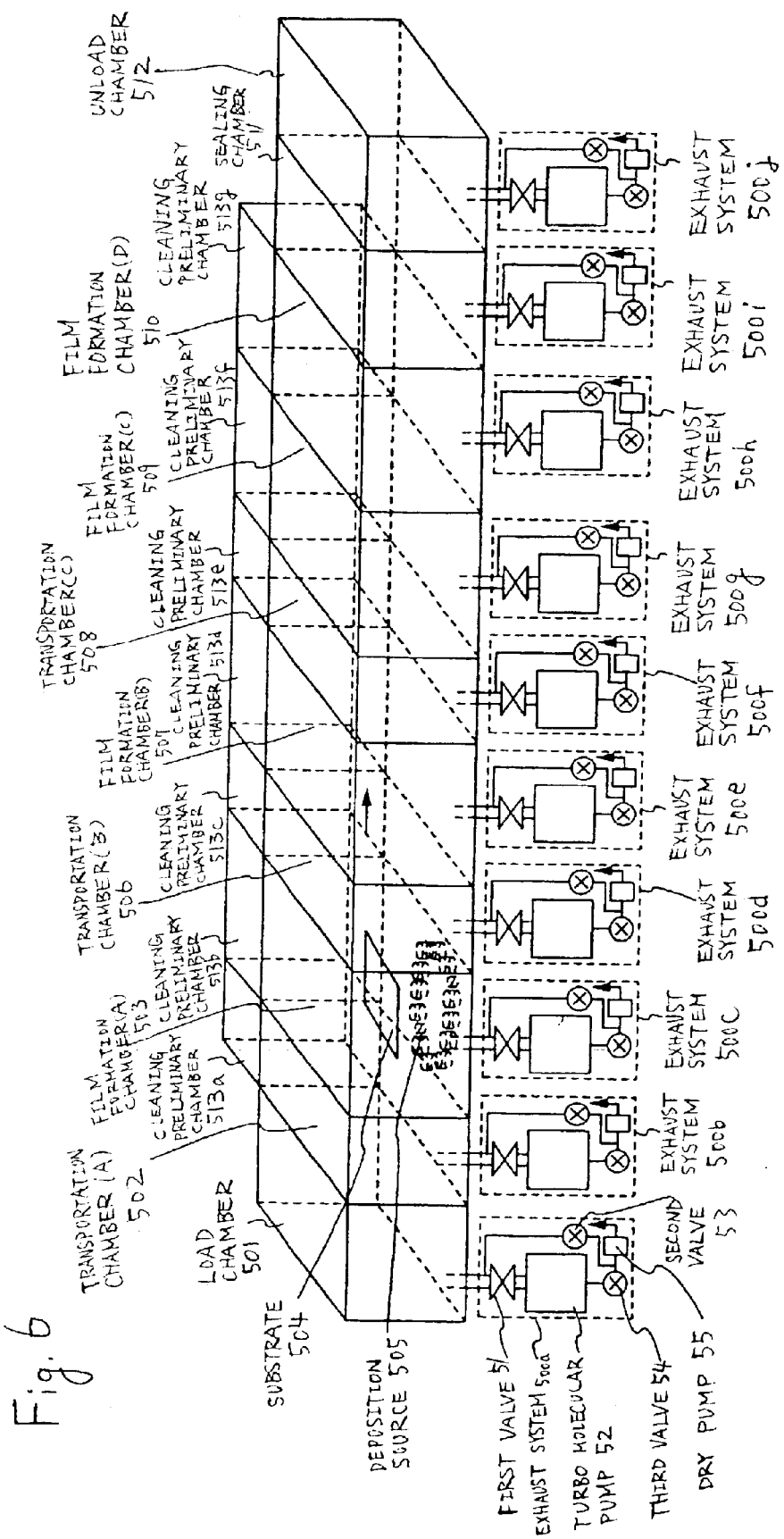

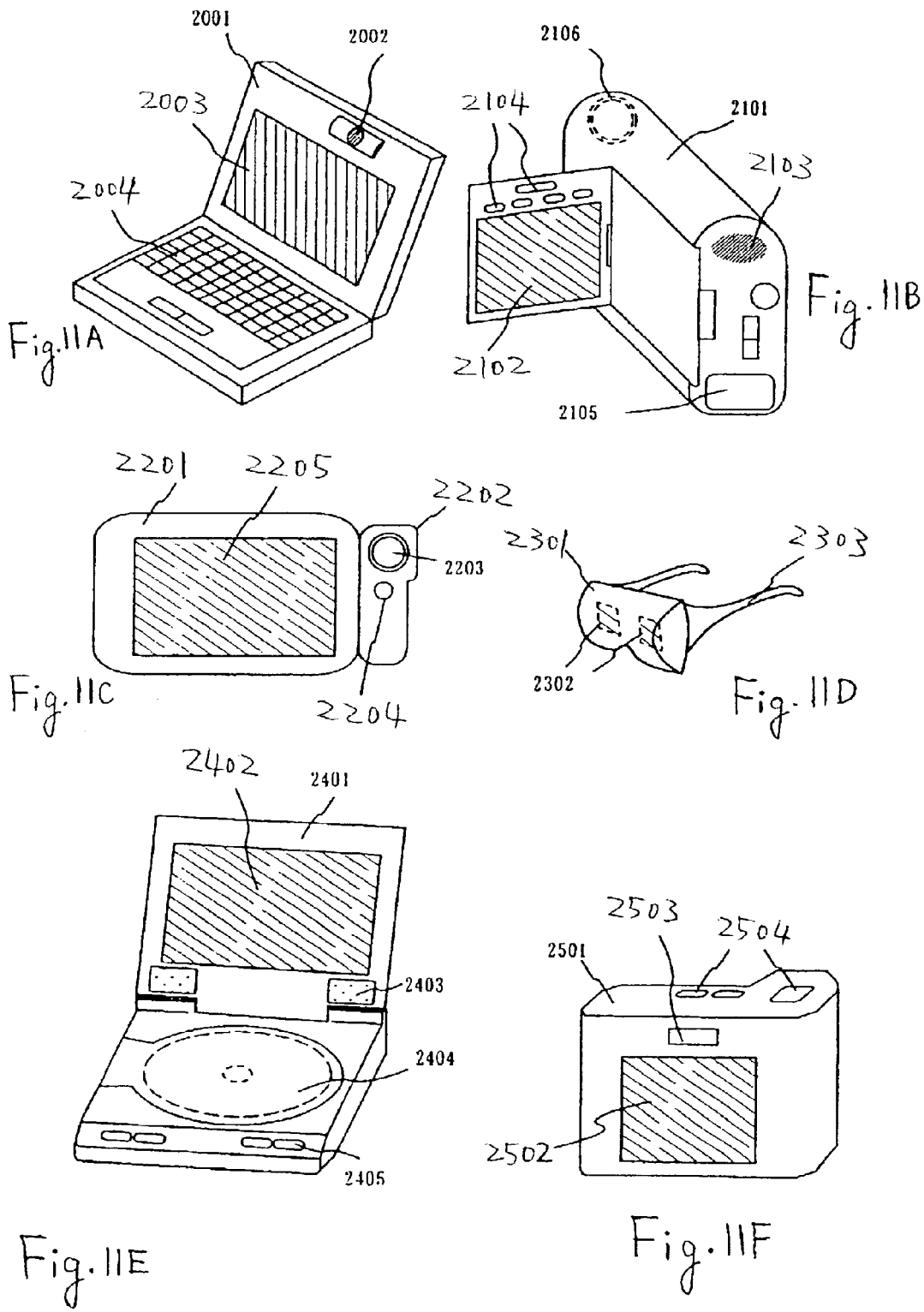

FILM FORMATION APPARATUS AND FILM FORMATION METHOD AND CLEANING METHOD

BACKGROUND OF THE INVENTION

1. Field of the Invention

The present invention relates to a film formation apparatus and a film formation method employed for film formation of a film formable material (hereinafter, referred to as a deposition material) by deposition. Additionally, the invention relates to a cleaning method for removing a deposition material adhering to the inner wall or the like by the deposition. Particularly, the invention is an efficient technique in the case an organic material is used as the deposition material.

2. Related Art

In recent years, investigations of light emitting apparatuses comprising EL elements as self-luminous type elements have been enthusiastically carried out and specially, light emitting apparatuses using organic materials as EL materials have drawn attention. Such a light emitting apparatus is called as an organic EL display (OELD) or an organic light emitting diode (OLED).

The EL element comprises a layer (hereinafter referred to as an EL layer) containing an organic compound capable of emitting electroluminescence by electric field application, an anode, and a cathode. The luminescence in the organic compound includes light emission (fluorescence) at the time of returning to the normal state from the singlet state and light emission (phosphorescence) at the time of returning to the normal state from triplet state and a light emitting apparatus to be manufactured by the film formation apparatus and the film formation method of the invention is applicable for cases using both fluorescence and phosphorescence.

The light emitting apparatus has a characteristic that it has no problem in the visible angle because it is self-luminous type, not a liquid crystal display apparatus. That is, as a display to be employed outdoors, the apparatus is more suitable than a liquid crystal display and application in various manners has been proposed.

The EL element has a structure in which the EL layer is sandwiched between a pair of electrodes and the EL layer generally has a layered structure. A typical example is a layered structure of a hole transporting layer/a light emitting layer/an electron transporting layer proposed by Tang, Eastman Kodak Co. The structure has a remarkably high light emitting efficiency and almost all of light emitting apparatuses which have been presently investigated and developed employ the structure.

Further, structures of a hole injecting layer/a hole transporting layer/a light emitting layer/an electron transporting layer formed successively on an anode and of a hole injecting layer/a hole transporting layer/a light emitting layer/an electron transporting layer/an electron injecting layer may be employed. A fluorescent coloring material or the like may be doped in the light emitting layers. Further, these layers may be formed by using materials all with low molecular weights or using materials all with high molecular weights.

Incidentally, in the specification, all layers to be formed in a cathode and an anode are generically named as an EL layer. Accordingly, the above-mentioned hole injecting layer, hole transporting layer, light emitting layer, electron transporting layer, electron injecting layer are all included in the EL layer.

Also, in the specification, the light emitting element composed of a cathode, an EL layer, and an anode is called as an EL element and there are two types of the EL element: one is a simple matrix type in which the EL layer is formed between two kinds of stripe-like electrodes formed at right angles to each other and the other is an active matrix type in which the EL layer is formed between pixel electrodes connected to TFT and arranged in a matrix and a counter electrode.

The most important problem of the EL element on practical application is that the life of the element is insufficient. The deterioration of the element appears in a way that a non-light emitting region (a dark spot) is widened as the light emission is carried out for a long time and as a cause of the deterioration, the EL layer deterioration becomes an issue.

The EL materials forming the EL layer are deteriorated by impurities such as oxygen, water and the like. Further, it may be also possible that the deterioration of the EL layer is affected by contamination of the EL materials with other impurities.

Further, the EL materials are divided broadly into low molecular weight (monomer-type) materials and high molecular weight (polymer-type) materials and among them, the low molecular weight materials are mainly formed into films by deposition.

In the case of film formation by a conventional deposition method, a deposition material is used as it is, but the deposition material for the deposition, is supposed to be contaminated with impurities. That is, oxygen, water, and other impurities, which are one of the causes of deterioration of the EL element, are probably mixed therein.

Further, although the purity can be increased by previously refining the deposition material, there is probability that impurities are mixed by the time when evaporation is carried out.

EL materials are extremely susceptible to deterioration and easily oxidized and deteriorated in the presence of oxygen or water. For that, a photolithographic process cannot be carried out after film formation and in order to form a pattern, the film has to be separated using a mask having openings (hereinafter referred to as a deposition mask) simultaneously with film formation. Accordingly, almost all of the sublimated organic EL materials adhere to a deposition mask or a deposition-preventing shield (a protective plate for preventing adhesion of the deposition materials to the inner walls of a film formation chamber) in the film formation chamber.

In order to remove the organic EL materials adhering to the deposition mask or the deposition preventing shield, it is required to open the film formation chamber to the atmospheric air once, take the deposition mask or the deposition preventing shield outside and then return it again to the film formation chamber after washing it. However, water or oxygen adsorbed in the deposition mask or the deposition preventing shield exposed to the atmospheric air may be probable to be isolated and taken in the film at the time of film formation using the organic EL materials and thus it is apprehended that adsorbed water or oxygen may be a factor of promoting deterioration of the organic EL materials.

The invention is achieved in consideration of the above-mentioned problems and has an aim to provide a film formation apparatus capable of forming an EL layer with a high throughput, a high density, and a high purity. Another aim of the invention is to provide a film formation method using the film formation apparatus of the invention.

Additionally, another aim of the invention is to provide a cleaning method for removing deposition materials adhering to jigs installed in the inside of the film formation apparatus of the invention and the inner wall of the film formation apparatus without exposing them to the atmospheric air and to provide a film formation apparatus provided with the mechanism for carrying out the cleaning method. Incidentally, in the specification, the jigs installed in the inside of the foregoing film formation apparatus include a substrate holder, a mask holder, a deposition preventing shield and a deposition mask.

SUMMARY OF THE INVENTION

A film formation apparatus of the invention is a film formation apparatus for forming a film on a substrate by depositing an organic compound material from a deposition source installed on the opposite to the substrate; wherein a film formation chamber to install the substrate therein comprises a deposition source, a means for heating the deposition source, and a heating means for heating a mask and the film formation chamber is communicated with a vacuum gas discharge treatment chamber for vacuum evacuating the film formation chamber.

The invention provides a method for forming a highly dense EL layer by heating a substrate by a means for heating the substrate and further decreasing the pressure to $5\times10^{-3}$ Torr (0.665 Pa) or lower, preferably to $1\times10^{-3}$ Torr (0.133 Pa) or lower, by a pressure decreasing means (a vacuum pump such as a turbo-molecular pump, a dry pump, a cryopump and the like) connected to the film formation chamber and depositing an organic compound material from the deposition source to carry out film formation. Accordingly, in the invention, annealing can be carried out in vacuum simultaneously with the film formation. Alternatively, the substrate may be annealed in vacuum before the film formation. Also, the substrate may be annealed in vacuum after the film formation. The temperature $(T_1)$ of the foregoing substrate is set to be lower than the temperature $(T_3)$. Further, as the means for heating the substrate, a stage (optionally having a function of fixing the substrate) in which a heater and an electric heating wire are formed or a metal mask in which a heater and an electric heating wire are formed is used to heat while being installed closely to or in the vicinity of the substrate and the temperature $(T_1)$ of the substrate is controlled to be 50 to 200° C., preferably 65 to 150° C. In the present invention, by heating the substrate, the deposition mask installed closely to or in the vicinity of the heated substrate is also heated. Accordingly, it is preferable for the deposition mask to be made of a metal material (e.g. a high melting point metal such as tungsten, tantalum, chromium, nickel, molybdenum and alloys containing these elements) a stainless steel, Inconel, Hastelloy and the like which are hardly deformed by heating (having a low thermal expansion coefficient) and durable to the temperature $(T_1)$ of the substrate. For example, a low thermal expansion alloy (42 alloy) containing nickel 42% by weight and 58% by weight and a low thermal expansion alloy (36 Invar) containing nickel 36% by weight having a thermal expansion coefficient near to that $(0.4\times10^{-6}$ to $8.5\times10^{-6})$ of a glass substrate can be exemplified.

Further, it is preferable to install an adhesion prevention means for preventing the organic compound from adhering to the inner wall of the film formation chamber at the time of deposition and the film formation apparatus of the invention is a film formation apparatus for forming a film on a substrate by depositing an organic compound material from a deposition source installed on the opposite to the substrate; wherein a film formation chamber to install the substrate therein comprises an adhesion prevention means for preventing film formation in the inner wall, a heating means for heating the adhesion prevention means, the deposition source, a means for heating the deposition source, and a heating means for heating the substrate or a mask (a deposition mask) and the film formation chamber is communicated with a vacuum gas discharge treatment chamber for vacuum evacuating the film formation chamber.

As the adhesion prevention means, a deposition preventing shield is preferable and a heater is installed in the surrounding of the deposition preventing shield to heat the entire body of the deposition preventing shield and set the temperature $(T_2)$ of the deposition preventing shield to be higher than the temperature $(T_1)$ of the substrate by at least 10° C., so that an organic compound which is not deposited on the substrate can be stuck to the substrate. Further, by heating the deposition preventing shield to a certain temperature (the sublimation temperature of the organic compound) or higher, cleaning of the film formation chamber can be carried out by evaporating the adhering organic compound.

In the invention, the temperature $(T_1)$ of the substrate at the time of film formation is set to be lower than the temperature $(T_2)$ of the deposition preventing shield and the temperature $(T_2)$ of the deposition preventing shield is set to be lower than the temperature $(T_3)$ of the deposition source. Further, using the film formation apparatus of the invention, an inline-type film formation apparatus can be obtained and such a film formation apparatus of the invention is a film formation apparatus comprising a load chamber, a transportation chamber, and a film formation chamber joined to each other in series; wherein the film formation chamber has a function of conforming the positioning of a mask and a substrate and the film formation chamber is communicated with a vacuum gas discharge treatment chamber for vacuum evacuating the film formation chamber and comprises an adhesion prevention means for preventing film formation in the inner wall, a heating means for heating the adhesion prevention means, the deposition source, a means for heating the deposition source, and a heating means for heating a substrate or a mask (a deposition mask).

Further, using the film formation apparatus of the invention, a multichamber-type film formation apparatus can be obtained and such a film formation apparatus of the invention is a film formation apparatus comprising a load chamber, a transportation chamber, and a film formation chamber joined to each other in series; wherein the transportation chamber has a function of conforming the positioning of a mask and a substrate and the film formation chamber is communicated with a vacuum gas discharge treatment chamber for vacuum evacuating the film formation chamber and the film formation chamber comprises an adhesion prevention means for preventing film formation in the inner wall, a heating means for heating the adhesion prevention means, the deposition source, a means for heating the deposition source, and a heating means for heating a substrate or a mask (a deposition mask).

In the above-mentioned respective film formation apparatuses, a plurality of deposition sources are arranged in one film formation chamber and in a single film formation chamber, a plurality of functional regions can be formed and thus a light emitting element having mixed regions can be formed. Accordingly, in the case an organic compound film comprising a plurality of functional regions is formed between an anode and a cathode of a light emitting element, unlike a conventional layered structure in which clear interfaces exist, a structure in which a mixed region of both of a material composing a first functional region and a material composing a second functional region is formed between the first functional region and the second functional region can be formed. In accordance with the invention, before the film formation or during the film formation, vacuum annealing is carried out, so that molecules in the mixed region can be fitted better with one another. Formation of the mixed region moderates the energy barrier between functional regions. Consequently, the driving voltage can be lowered and the deterioration of brightness can be prevented.

The first organic compound and the second organic compound have properties selected from a group consisting of a hole injecting property to receive hole from an anode, a hole transporting property with higher hole mobility than electron mobility, an electron transporting property with higher electron mobility than hole mobility, an electron injecting property to receive electron from a cathode, a blocking property to inhibit hole or electron transportation, and a light emitting property showing luminescence and respectively have different properties.

As the organic compound with a high hole injecting property, a phthalocyanine type compound is preferable and as the organic compound with a high hole transporting property, an aromatic diamine compound is preferable and as an organic compound with a high electron transporting property, a metal complex containing a quinoline skeleton, a metal complex containing a benzoquinoline skeleton, an oxadiazole derivative, a triazole derivative, or a phenanthroline derivative is preferable. Further, as an organic compound showing luminescence, a metal complex containing a quinoline skeleton, a metal complex containing a benzoxazole skeleton, or a metal complex containing a benzothiazole skeleton, which is capable of stably emitting luminescence, is preferable.

Further preferably, a light emitting region is composed of a host material and a light emitting material (a dopant) whose excitation energy is lower than that of the host material and the excitation energy of the dopant is planed to be lower than the excitation energy of a hole transporting region and the excitation energy of the electron transporting layer. Due to that, dispersion of excited molecules of a dopant can be prevented and the dopant can efficiently emit luminescence. Further, in the case a dopant is a carrier trap type material, the re-coupling efficiency of the carrier can be heightened.

Further, the invention includes a case that as a dopant, a material capable of converting triplet excitation energy to luminescence is added to the mixed region. In the mixed region formation, the mixed region may have a concentration grade.

The film formation apparatus of the invention can be employed for film formation of not only an organic compound such as the EL material but also other materials such as metal materials to be employed for deposition.

Further, by radiating laser beam and scanning the laser beam in the inner wall of the film formation chamber, cleaning can be carried out and thus the film formation apparatus of the invention includes a film formation apparatus for forming a film on a substrate by depositing an organic compound material from a deposition source installed on the opposite to the substrate; wherein a film formation chamber to install the substrate therein comprises a deposition source, a means for heating the deposition source, and a heating means for heating a substrate, and the film formation chamber is communicated with a vacuum gas discharge treatment chamber for vacuum evacuating the film formation chamber and also with a cleaning preparatory chamber for radiating laser beam to the inner wall of the treatment chamber.

In the foregoing constitution, the above-mentioned laser beam can be scanned by a galvano-mirror or a polygon mirror to evaporate the deposited matter adhering to the inner wall of the film formation chamber, a deposition preventing shield, or a deposition mask and carry out cleaning. With the above-mentioned constitution, without the film formation chamber being exposed to atmospheric air at the time of maintenance, cleaning can be carried out.

The above-mentioned laser beam may include laser beam from laser beam source such as continuously oscillating or pulse oscillating solid laser, continuously oscillating or pulse oscillating excimer laser, Ar laser, Kr laser and the like. The above-mentioned solid laser includes one or a plurality of types selected from YAG laser, $YVO_4$ laser, YLF laser, $YAlO_3$ laser, glass laser, ruby laser, alexandrite laser, Ti:sapphire laser.

Further, a film formation apparatus having a plasma generation means in a film formation apparatus provided with a deposition source is also among the invention and another constitution regarding the film formation apparatus of the invention is a film formation apparatus for forming a film on a substrate by depositing an organic compound material from a deposition source installed on the opposite to the substrate; wherein a film formation chamber to install said substrate therein comprises a deposition source, a means for heating the deposition source, a heating means for heating a substrate, a mask (a deposition mask), and an electrode on the opposite to the mask and the film formation chamber is communicated with a vacuum gas discharge treatment chamber for vacuum evacuating the film formation chamber and plasma is generated in the film formation chamber.

In the above-mentioned constitution, the foregoing mask is made of a conductive material and either the foregoing mask or the foregoing electrode is connected with a high frequency power source (frequency of 13 MHz to 40 MHz and high frequency power 20 W to 200 W). The interval of the mask and the electrode may be adjusted to be 1 cm to 5 cm. Also, in the above-mentioned constitution, the foregoing film formation chamber is provided with a gas introducing means for introducing one or a plurality of kinds of gases selected from Ar, H, F, $NF_3$, and O into the film formation chamber and a means for discharging the evaporated deposition substance.

Further, in the above-mentioned constitution, it is preferable that the deposition mask to be one electrode for generating plasma is made of a material having conductivity and a high melting point metal such as tungsten, tantalum, chromium, nickel, molybdenum and alloys containing these elements) a stainless steel, Inconel, Hastelloy and the like which are hardly deformed by heating (having a low thermal expansion coefficient) and durable to plasma is preferable to be employed. Further, in order to cool the heated deposition mask, a mechanism for circulating a cooling medium (cooling water, cooling gas) in the deposition mask may be installed.

By the above-mentioned plasma generating means, plasma is generated in the film formation chamber and the deposited substance adhering to the inner wall of the film formation chamber, the deposition-preventing shield, or the deposition mask is evaporated and discharged out the film formation chamber to carry out cleaning. With the above-mentioned constitution, cleaning can be carried out without the film formation chamber being exposed to the atmospheric air at the time of maintenance.

The cleaning method using the film formation apparatus with the above-mentioned constitution is also included in the invention and a cleaning method for removing an organic compound adhering to a film formation chamber provided with a deposition source and carried out for cleaning the inner wall, an adhesion prevention means for preventing film formation on the inner wall, or a mask by generating plasma in the film formation chamber.

In the constitution of the above-mentioned cleaning method, the foregoing plasma is generated between the mask and an electrodes installed between the mask and the deposition source.

In the constitution of the above-mentioned cleaning method, the plasma is generated by exciting one or a plurality of kinds of gases selected from Ar, H, F, $NF_3$, and O.

BRIEF DESCRIPTION OF THE DRAWINGS

FIGS. 4A and 4B show figures illustrating element structures to be produced by a film formation apparatus of the invention (Example 1).

FIGS. 5A and 5B show figures illustrating film formation apparatuses of the invention (Example 2).

FIG. 6 shows a figure illustrating a film formation apparatus of the invention (Example 3).

FIGS. 11A to 11F show figures illustrating one example of an electronic apparatus.

PREFERRED EMBODIMENTS OF THE INVENTION

Embodiments of the invention will be described below.
Embodiment 1

Figure 1:
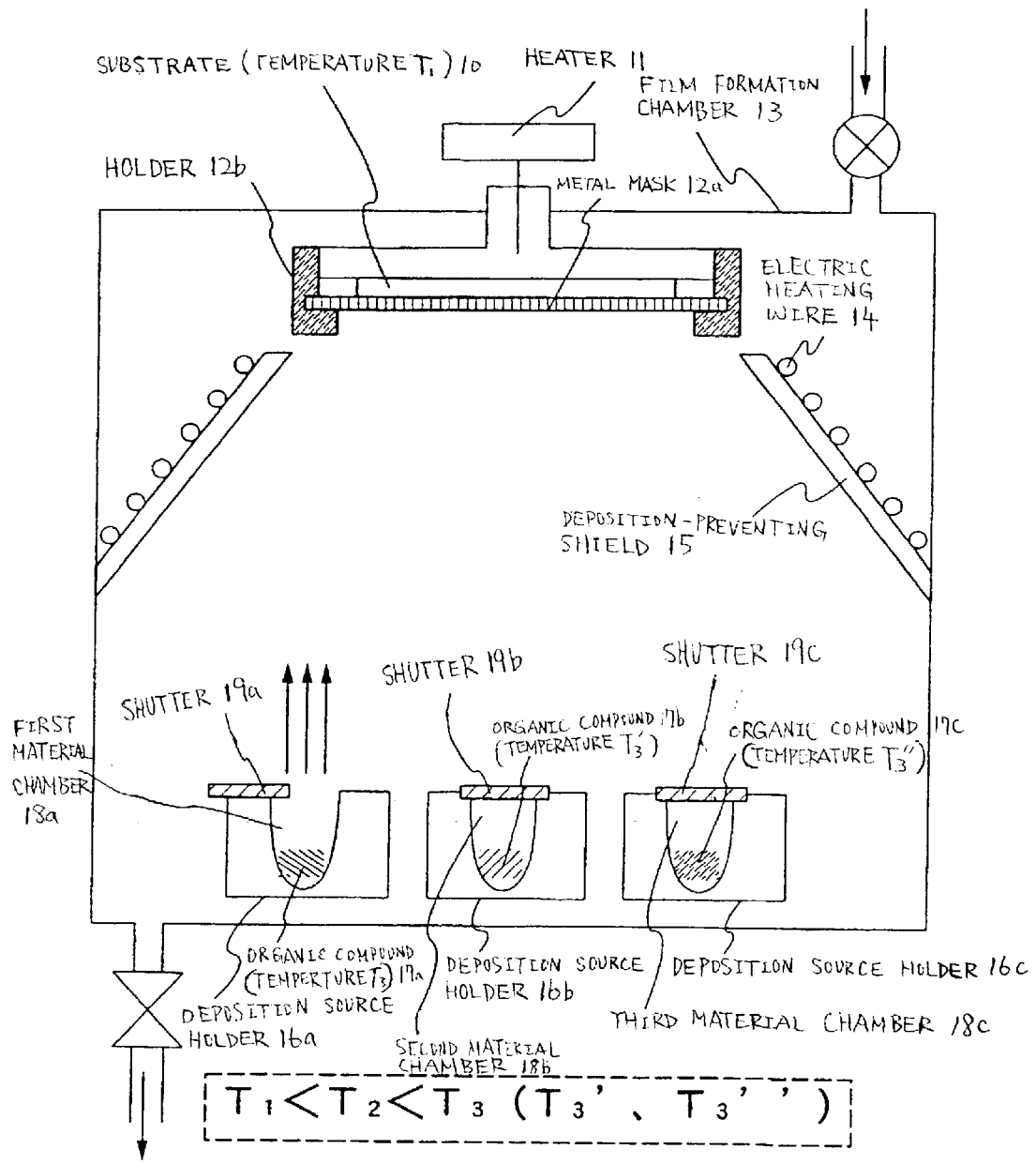
FIG. 1 shows a film formation apparatus of the invention (Embodiment 1).

The constitution of a film formation apparatus of the invention will be described with reference to FIG. 1. FIG. 1 is one example of a cross-sectional view of the film formation apparatus of the invention.

At the time of forming a film by a deposition method, a face down method (referred to as a depositing-up method in some cases) is preferable and a substrate 10 is set in a manner that the face to form a film thereon is face down. The face down method is a method by which a film is formed while the face to form film of the substrate being kept face down and in such a method, adhesion of dust or the like can be suppressed.

As shown in FIG. 1, a heating means, in this case a heater 11, is installed adjacently to the substrate 10. By the heating means, the temperature ($T_1$) of the substrate can be heated to 50 to 200° C., preferably 65 to 150° C. Further, a metal mask 12a fixed in a holder 12b is installed under the substrate 10 and deposition source holders 16a to 16c capable of heating at different temperatures respectively are also installed further under the mask. A deposition source is installed on the opposite to the substrate. In this case, the substrate fixed in the holder 12b is exemplified, but it may be fixed by the metal mask using a permanent magnet.

In FIG. 1, since the metal mask 12a (referred to as a deposition mask in some cases) is installed adjacently to the substrate 10, when the substrate is heated, the metal mask is simultaneously heated. By the heating means for the substrate and the metal mask, the entire body of the substrate can be heated. Accordingly, the metal mask (the deposition mask) is preferably made of a metal material which is hardly deformed by heat and durable to the temperature ($T_1$) of the substrate. Further, the deposition mask is not limited to a metal material and a mask (of glass or quartz bearing a light shielding film on the surface) made of another material durable to the temperature ($T_1$) of the substrate may be used. Incidentally, in this case, the metal mask 12a installed adjacently to the substrate 10 is exemplified, the invention is not limited to the example, and a substrate and a metal mask may be parted from each other.

Further, a heating means (a heater and an electric heating wire) may be installed adjacently to the metal mask or a heating means (a heater and an electric heating wire) may be installed in the metal mask itself to heat the metal mask, so that the substrate adjacent to the metal mask can be heated. By heating the metal mask, the substrate surface in the side where film formation is carried out can be heated.

In this case, the deposition source is composed of deposition source holders 16a to 16c, organic compounds 17 (17a to 17c) forming an organic compound film, and material chambers 18 (18a to 18c) containing organic compounds, and shutters 19 (19a to 19c). Further, it is preferable that an organic compound is introduced through an exclusive material exchange chamber (not illustrated) attached to the film formation chamber so as to avoid opening of the film formation chamber to the atmospheric air to the utmost. Opening the film formation chamber to the atmospheric air allows water and various gases are adsorbed in the inner wall and released again by vacuum evacuating the chamber. Several tens or hundred hours are taken to subside the release of the adsorbed gases and stabilize the vacuum degree to the equilibrium value. Therefore, baking treatment for the wall of the film formation chamber is carried out to shorten the time. However, repeat of the opening to the atmospheric air is not an efficient means, an exclusive material exchange chamber is preferable to be installed.

In the film formation chamber of the invention, the deposition source or the substrate in which deposition is to be carried out is better to be made movable (or rotatable). FIG. 1 shows an example in which the substrate to deposit a film thereon is made rotatable and also a metal mask 12a and a holder 12b are made rotatable. Alternatively, while the substrate being fixed, the deposition holder may be moved in the x-direction or y-direction relative to the substrate to carry out deposition.

Material chambers 18 (18a to 18c) are spaces of the deposition source holders 16a to 16c made of a conductive metal material and when the organic compounds 17 (17a to 17c) in the insides are heated to the respective sublimation temperature ($T_3$, $T_3'$, $T_3''$) by the heating means [resistance generated at the time of voltage application (resistance heating)] installed in the deposition source holder, they are evaporated and deposited on the surface of the substrate 10. The heating means are basically of a resistance heating type, however a Knudsen cell maybe employed. Incidentally, in this specification, the surface of the substrate 10 includes a thin film formed on the substrate and in this case, an anode or a cathode is formed on the substrate.

The shutters 19 (19a to 19c) control the deposition of the evaporated organic compounds 17 (17a to 17c). That is, when the shutters are opened, the organic compounds 17 (17a to 17c) evaporated by heating can be deposited. Further one or a plurality of other shutters (for example, shutters for covering the deposition sources until the sublimation from the deposition sources is stabilized) may be installed between the substrate 10 and the shutters 19.

Since the film formation time can be shortened, it is preferable that the organic compounds 17 (17a to 17c) are evaporated by heating before the deposition so as to make the deposition possible as soon as the shutters 19 (19a to 19c) are opened at the time of the deposition.

Further, in the film formation apparatus of the invention, an organic compound film having a plurality of functional regions can be formed in one film formation chamber and a plurality of deposition sources are formed according to that. The organic compounds evaporated in the respective deposition sources are deposited on the substrate 10 through openings (not illustrated) formed in the metal mask 12a. Incidentally, the openings of the metal mask may be rectangular, elliptical, or liner and they may be arranged in matrix-like shape or delta arrangement.

Further, impurities (high temperature materials) deposited at a higher temperature than high purity EL materials (middle temperature materials) or impurities (low temperature materials) deposited at a lower temperature are separated based on the deposition temperature difference of the deposition materials to carry out film formation only from the high purity EL materials. Further, in this specification, substances (impurities) with a higher sublimation temperature than that of the high purity EL materials are named as high temperature materials and substances (impurities) with a lower sublimation temperature are named as low temperature materials. Also, the high purity EL materials sublimated at a middle temperature between the higher temperature and the lower temperature are named as middle temperature materials. Incidentally, the materials deposited at respective temperatures are previously analyzed by mass spectrometry (GC-MS) to investigate the sublimation temperature of the pure EL materials.

The deposition materials may be subjected to sublimation refining before deposition. To refine the deposition materials, a zone refining method may be employed.

A deposition-preventing shield 15 for preventing adhesion of an organic compound to the inner wall at the time of deposition is installed. Installation of the deposition-preventing shield 15 makes it possible to deposit an organic compound which cannot be deposited on the substrate. In the surrounding of the deposition-preventing shield 15, an electric heating wire 14 is adjacently laid and by the electric heating wire 14, the entire body of the deposition-preventing shield 15 can be heated. At the time of film formation, the temperature ($T_2$) of the deposition-preventing shield 15 is preferable to be higher than the temperature ($T_1$) of the substrate by at least 10° C.

Further, the film formation chamber 13 is connected to a vacuum discharge treatment chamber for vacuum-evacuating the film formation chamber. The vacuum discharge treatment chamber is provided with a magnetically floating type turbo-molecular pump, a cryopump, a dry pump, and the like. Accordingly, $10^{-5}$ to $10^{-6}$ Pa vacuum degree of the film formation chamber can be achieved and reverse diffusion of impurities from the pump side and a gas discharge system can be controlled.

Further, the film formation chamber 13 is connected to a gas introduction system for restoring a normal pressure in the film formation chamber. In order to prevent introduction of impurities in the inside of the apparatus, as a gas to be introduced, an inert gas such as nitrogen, a rare gas and the like are used. These gases to be introduced into the inside of the apparatus are subjected to be highly purified by a gas refining apparatus before the introduction into the apparatus. Accordingly, a gas refining apparatus is required to be installed so as to introduce highly purified gases into the apparatus after the purification. As a result, oxygen and water and other impurities contained in the gases can be removed previously, so that introduction of these impurities into the inside of the apparatus can be prevented.

As a material to be employed for the inside of the film formation chamber, aluminum and stainless steel (SUS) specularly polished by electrolytic polishing can be employed for the inner wall faces since their adsorption capacity of impurities such as oxygen and water can be decreased by narrowing the surface area. Accordingly, the vacuum degree in the inside of the film formation chamber can be kept at $10^{-5}$ to $10^{-6}$ Pa. Also, a material such as a ceramic or the like subjected to the treatment to extremely decrease the pores may be used for the inner member. These materials are preferable to have a surface smoothness equivalent to 3 nm or less average roughness between center lines.

In the film formation apparatus of FIG. 1, since the film formation is carried out using a plurality of material rooms in the same film formation chamber, a function to move the material rooms containing organic materials to be employed for the film formation to the optimum positions under the substrate at the time of film formation or to move the substrate to the optimum position above the material rooms may be installed in order to improve the film formation efficiency.

Using the film formation apparatus shown in FIG. 1 makes it possible to carry out annealing in vacuum before film formation, annealing in vacuum during film formation, or annealing in vacuum after film formation to result in improvement of through-put. Further, an annealing chamber enabled to be vacuum evacuated is connected to the film formation chamber and the substrate is transported in vacuum, so that the annealing in vacuum before film formation in the annealing chamber connected to the film formation chamber or the annealing in vacuum after film formation can be carried out.

Hereinafter, using the film formation apparatus of FIG. 1, a manufacturing procedure of a light emitting apparatus comprising an anode, an organic compound layer adjacent to the anode, and a cathode adjacent to the organic compound layer will be described with the reference to FIG. 2. FIG. 2 is a chart showing the flow after transportation to the film formation chamber.

At first, a substrate in which an anode is formed is transported to a transportation chamber (not illustrated). As a material for formation of the anode, a transparent conductive material is used and an indium-tin compound, zinc oxide and the like can be employed. Next, it is transported to a film formation pretreatment chamber (not illustrated) connected to the transportation chamber (not illustrated). In the film formation pretreatment chamber, cleaning, oxidation treatment, or heating treatment for the anode surface may be carried out. As the cleaning of the anode surface, the anode surface is cleaned by radiating UV rays in vacuum. Also, as the oxidation treatment, UV rays are radiated in oxygen-containing atmosphere while heating at 100 to 120° C. being carried out and in the case the anode is an oxide such as ITO, the treatment is effective. Further, as the heating treatment, heating is carried out in vacuum at a heating temperature of 50° C. or higher, preferably 65 to 150° C., which the substrate can stand to remove impurities such as oxygen, water and the like adhering to the substrate and impurities such as oxygen, water and the like existing in the film formed on the substrate. Especially, since an EL material is susceptive to deterioration by impurities such as oxygen, water and the like, heating in vacuum before deposition is effective.

Next, the substrate subjected to the above-mentioned pretreatment is transported to a film formation chamber 13 without being exposed to atmospheric air. In the film formation chamber 13, the substrate 10 is set while the face to form a film thereon being set downward. Incidentally, the film formation chamber is preferable to be vacuum-evacuated before the substrate is transported.

The vacuum evacuation means installed while being connected to the film formation chamber is vacuum-evacuated by an oil-free dry pump from the atmospheric pressure to about 1 Pa and further vacuum-evacuated to the lower pressure by magnetically floating type turbo-molecular pump or compounded molecular pump. A cryopump may be installed in combination in the film formation chamber in order to remove water. In such a manner, contamination with organic substances, mainly oil, from the discharge means is prevented. The inner wall face is specularly treated by electrolytic polishing to decrease the surface area and prevent the gas emission. For the purpose of decreasing the gas emission from the inner wall, a heater is preferable to be installed in the outside of the film formation chamber to carry out baking treatment. Gas emission can be suppressed greatly by the baking treatment. Further, in order to prevent the contamination with the impurities owing to the gas emission, cooling using a cooling medium at the time of deposition is preferable to be carried out. In such a manner, a vacuum degree as far as $1 \times 10^{-6}$ Pa can be achieved.

At the time of vacuum evacuation of the film formation chamber, adsorbed water and adsorbed oxygen adhering to the inner wall of the film formation chamber, the metal mask, and the deposition preventing shield can be also removed simultaneously. Further, the film formation chamber is preferable to be heated before the substrate is transported in. It takes time to gradually cool the substrate which is heated by the pretreatment and again heated after being transported in the film formation chamber to result in decrease of the through-put. Desirably, the substrate which is heated by the heating treatment carried out as pretreatment is transported and set in the film formation chamber as it is heated without being cooled. The apparatus illustrated in FIG. 1, since the heating means for heating the substrate is installed, the heating treatment in the vacuum, which is the pretreatment, can be carried out in the film formation chamber.

Now, heating treatment (annealing) in vacuum in the film formation chamber is carried out before deposition. By the annealing (degassing), impurities such as oxygen, water and the like adhering to the substrate and impurities such as oxygen, water and the like existing in the film formed on the substrate are removed. In order to remove the impurities removed in such a manner, vacuum evacuation is preferable to be carried out and the vacuum degree may be increased further.

Next, deposition is carried out in the film formation chamber 13 which is vacuum-evacuated to the vacuum degree of $5 \times 10^{-3}$ Torr (0.665 Pa), preferably $10^{-4}$ to $10^{-6}$ Pa. At the time of deposition, a first organic compound 17a is evaporated by resistance heating and scattered toward the substrate 10 when the shutter 19a is opened at the time of deposition. The evaporated organic compound is scattered upward and passed through the openings (not illustrated) formed in the metal mask 12a and deposited on the substrate 10. Incidentally, at the time of deposition, the temperature ($T_1$) of the substrate is heated to 50 to 200° C., preferably 65 to 150° C., by a means for heating the substrate. At the time of deposition, the temperature ($T_1$) of the substrate is set to be lower than the temperature ($T_2$) of the deposition preventing shield and the temperature ($T_2$) of the deposition preventing shield is set to be lower than the temperature ($T_3$) of the deposition source. Further, the temperature ($T_2$) of the deposition preventing shield is set to be higher than the temperature ($T_1$) of the substrate by at least 10° C., so that an organic compound which cannot be deposited on the substrate can adhere to the substrate.

In the apparatus illustrated in FIG. 1, a heating means for heating the substrate is installed to carry out heating treatment during the film formation in vacuum. Since the deposition material at the time of deposition is probably contaminated with impurities such as oxygen, water and the like, it is effective to carry out heating treatment in vacuum during the deposition to emit gases contained in the film. In such a manner, while the substrate being heated in vacuum, deposition is carried out to form a film with a desired film thickness and consequently, an organic compound layer with a high density and a high purity can be formed. The organic compound in this case includes organic compounds having properties such as a hole injecting property to receive hole from an anode, a hole transporting property with higher hole mobility than electron mobility, an electron transporting property with higher electron mobility than hole mobility, an electron injecting property to receive electron from a cathode, a blocking property to inhibit hole or electron transportation, and a light emitting property showing luminescence.

In such a manner, deposition of the organic compound 17a is finished and a film of the organic compound 17a is formed on the anode.

Further, in order to decrease the impurities such as oxygen, water and the like in the obtained organic compound layer, heating under pressure of $1 \times 10^{-4}$ Pa or lower may be carried out to emit water or the like entrained at the time of deposition. Since the deposition material at the time of the deposition is probably contaminated with impurities such as oxygen, water and the like, it is effective to emit gases contained in the film by heating in vacuum after deposition. When annealing after deposition is carried out, it is preferable to transport the substrate to another treatment chamber other than the film formation chamber without exposing the substrate to the atmospheric air and then carry out annealing in vacuum.

In the apparatus illustrated in FIG. 1, since a heating means for heating the substrate is installed, it is possible to carry out heating treatment in vacuum after film formation in the film formation chamber. It is preferable to make the vacuum degree further than that at the time of deposition and then carry out annealing at 100 to 200° C. after deposition. By the annealing (degassing) after film formation, the impurities such as oxygen, water and the like in the organic compound layer formed on the substrate are further removed to form an organic compound layer with a high density and a high purity.

Figure 2A:
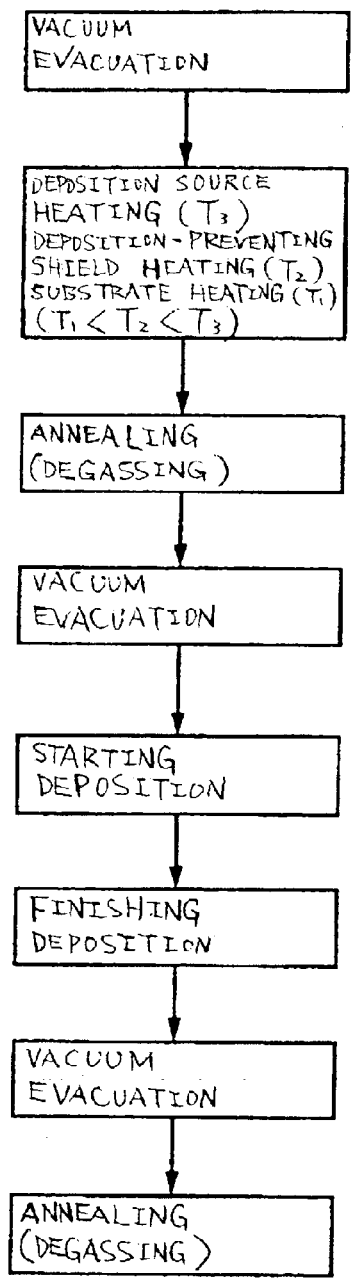
FIGS. 2A and 2B show charts showing the flows of the invention (Embodiment 1).

The steps described so far are for the case of forming a single layer of the organic compound 17a and corresponding to the flow shown in FIG. 2A.

Thereafter, the above-mentioned single layer formation steps are repeated to make desired organic compound layers and finally a cathode is laminated. Incidentally, in the case of layering different deposition materials (organic compounds and a cathode material), layering steps may be carried out in different film formation chambers or entirely in a single film formation chamber. As the material for the cathode, materials containing magnesium (Mg), lithium (Li), or calcium (Ca) with a small work function are employed. Preferably, an electrode made of MgAg (a material containing Mg and Ag mixed in Mg:Ag=10:1) may be used. Besides, ytterbium (Yb), a MgAgAl electrode, an LiAl electrode, and aLiFAl electrode can be exemplified. Consequently, a light emitting apparatus comprising the anode, the organic compound layers adjacent to the anode, and a cathode adjacent to the organic compound layers can be produced. Further, annealing before film formation can be carried out in the film formation chamber and in that case, the through-put is improved.

An example of formation of a layered structure of three layers in a single film formation chamber provided with three deposition sources will be described with the reference to the flow shown in FIG. 2B and FIG. 1. On completion of the deposition (first deposition) of the organic compound layer of the organic compound 17a by closing the shutter 19a according to the above-mentioned procedure of the single layer formation, an organic compound 17b in the inside is previously heated to the sublimation temperature ($T_3'$) by a heating means installed in a deposition holder and a shutter 19b is opened to start the deposition (second deposition) and form an organic compound layer of the organic compound 17b on the organic compound layer of the organic compound 17a. Successively, in the same manner, on completion of the deposition (second deposition) of the organic compound layer of the organic compound 17b by closing the shutter 19b, an organic compound 17c in the inside is previously heated to the sublimation temperature ($T_3''$) by a heating means installed in a deposition holder and a shutter 19c is opened to start the deposition (third deposition) and form an organic compound layer of the organic compound 17c on the organic compound layer of the organic compound 17b.

At the time of the first deposition, the second deposition, and the third deposition, the temperature ($T_1$) of the substrate is set to be lower than the temperature ($T_2$) of the deposition preventing shield and the temperature ($T_2$) of the deposition preventing shield is set to be lower than the temperatures ($T_3$, $T_3'$, $T_3''$) of the deposition sources. Incidentally, the temperatures of the respective deposition sources differ depending on the deposition materials to be used, so that the temperature ($T_1$) of the substrate and the temperature ($T_2$) of the deposition preventing shield may be properly changed depending on the respective temperatures of the deposition sources. Further, the vacuum degree is also changed properly at the time of the first deposition, the second deposition, and the third deposition.

Further, a plurality of shutters of the deposition sources can be opened simultaneously to carry out co-deposition. The co-deposition means a deposition method in which simultaneous evaporation of different deposition sources by heating is carried out and different substances are mixed in the film formation step.

At the time of the first deposition, the second deposition, and the third deposition, since evaporation is carried out while the substrate being heated in vacuum to carry out film formation until a desired film thickness is obtained, organic compound layers with a high density and a high quality can be obtained. Further, without being exposed to the atmospheric air, the deposition is carried out a plurality of times while the substrate being heated in vacuum so that the molecules in the interlayers of the respective layers are well fitted with one another.

Accordingly, the deposition of a plurality of different organic compounds is completed and stacked layers composed of the layer of the organic compound 17a, the layer of the organic compound 17b, and the layer of the organic compound 17c are formed on the anode.

Next, in the same manner as the formation of the single layer, in order to decrease the impurities such as oxygen, water and the like in the obtained organic compound layers, heating under pressure of $1 \times 10^{-4}$ Pa or lower may be carried out to emit water or the like entrained at the time of deposition. In the case annealing after deposition is carried out, the annealing may be carried out in the film formation chamber or annealing may be carried out in vacuum after the substrate is transported to another treatment chamber other than the film formation chamber without exposing the substrate to the atmospheric air.

Figure 2B:
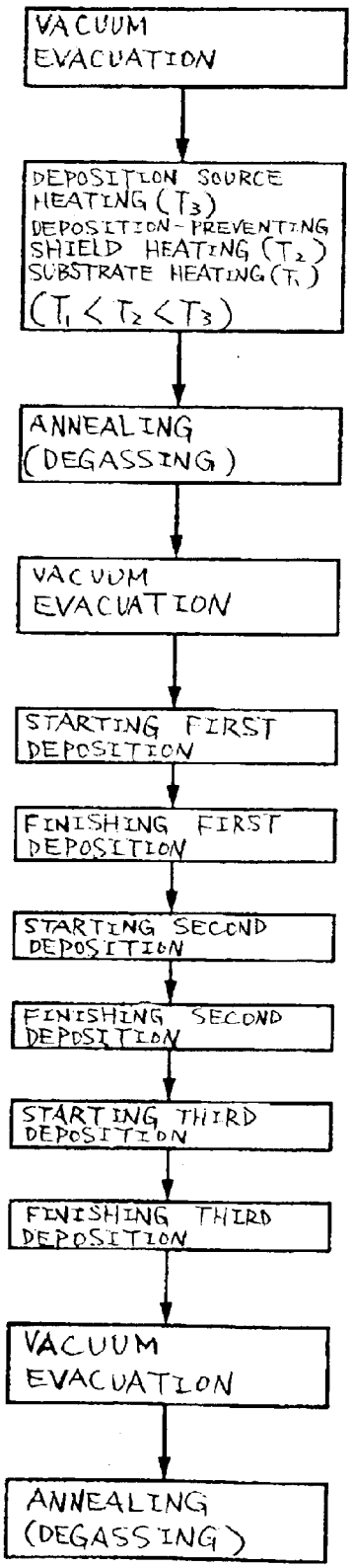

The steps described so far are for forming layers of the organic compounds and corresponding to the flow shown in FIG. 2B.

On completion of layering of desired organic compound layers according to the above-mentioned steps, finally a cathode is layered. In such a manner, a light emitting apparatus comprising the anode, the organic compound layers adjacent to the anode, and a cathode adjacent to the organic compound layers can be produced. In the case where layers are formed in a single film formation chamber as described above, transportation of the substrate can be omitted and further the time taken to evacuate the film formation chamber, to heat the substrate, and to gradually cool the substrate can be shortened to result in remarkable improvement of the through-put.

Further, after the above-mentioned formation of the single layer or stacked layers of the organic compounds is carried out once or a plurality of times, it is preferable to carry out cleaning. The cleaning is carried out by re-sublimation and gas discharge. To carry out re-sublimation, the inner wall of the film formation apparatus and the jigs installed in the inside of the film formation apparatus are heated and the heating method is carried out by any of heater heating, infrared heating, or UV heating and by combining these heating manners. Further, the re-sublimated deposition materials are preferable to be discharged immediately by using a vacuum pump. Also, a gas containing a halogen-group element is injected through a gas introduction system to carry out re-sublimation and simultaneously discharge the deposition materials in the form of fluorides.

Further, in cleaning carried out in the condition that no substrate is arranged, in the film formation apparatus of FIG. 1, the holder and the metal mask are heated by heating the heating means for the substrate to evaporate the organic compounds adhering to them. The organic compounds adhering to the deposition preventing shield can be evaporated by heating the deposition preventing shield by an electric heating wire 14. If cleaning is carried out, the heating means for the substrate and the heating means for the deposition preventing shield are preferably capable of controlling the temperature to the evaporation temperatures of the organic compounds. At the time of cleaning, the evaporated organic compounds are recovered by a gas discharge system (a vacuum pump) and the like to make them reusable.

Embodiment 2

Figure 3:
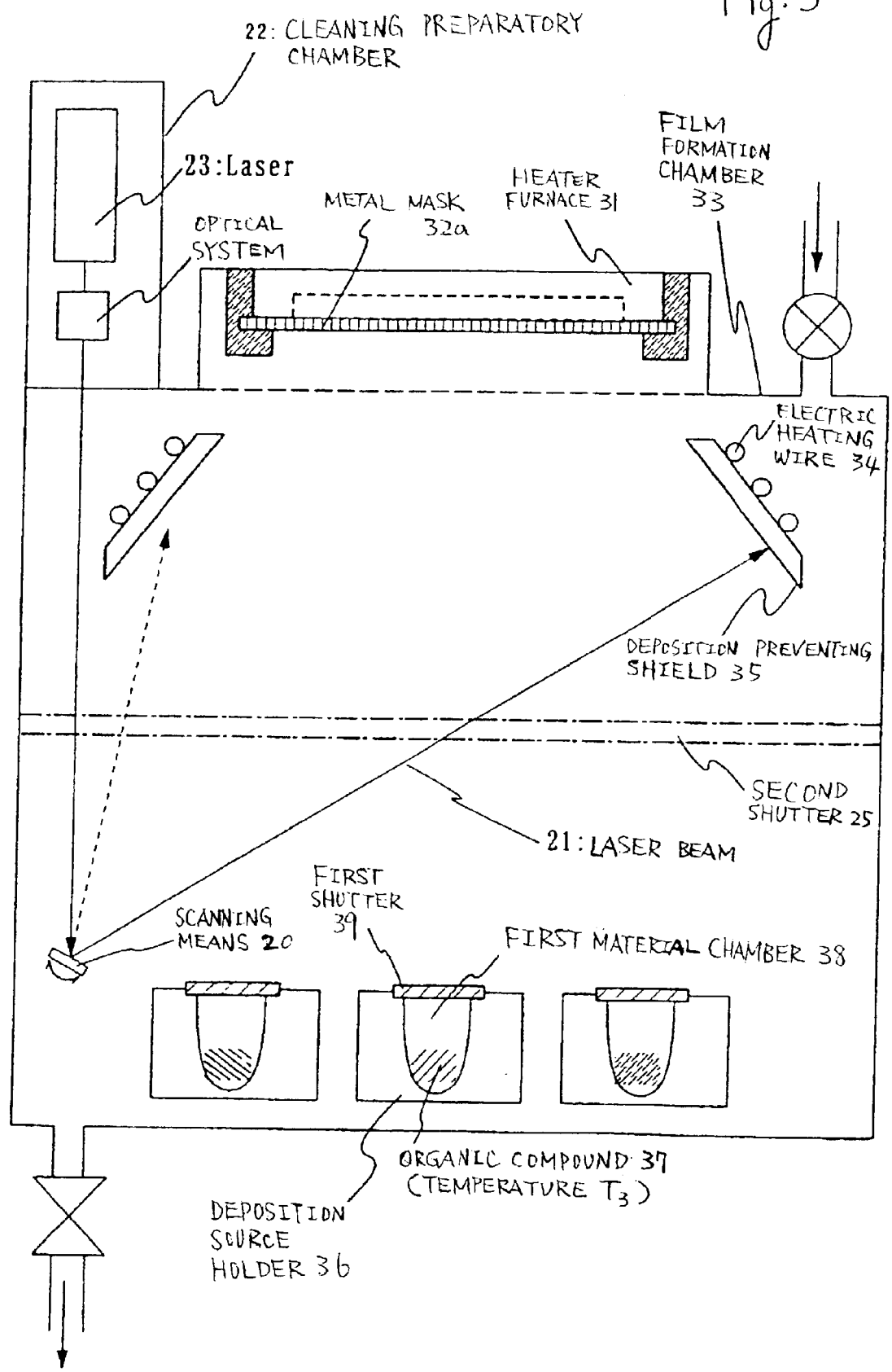
FIG. 3 shows a film formation apparatus of the invention (Embodiment 2).

Here, a film formation apparatus different from that of the embodiment 1 is illustrated in FIG. 3.

As shown in FIG. 3, an example in which a heater furnace 31 and a cleaning preparatory chamber 22 are installed while being connected to a film formation chamber 33 will be described.

The heater furnace 31 for heating a substrate is made capable of carrying out annealing treatment by installing a heater in the outside. By the heater furnace 31, the temperature ($T_1$) of the substrate is controlled to be 50 to 200° C., preferably 65 to 150° C. Further, a gate or a shutter shown as a dotted line in FIG. 3 is installed between the heater furnace 31 and the film formation chamber 33. Although it is not illustrated, a vacuum evacuation means may be additionally installed in the heater furnace 31. In this embodiment, after annealing is carried out in vacuum by the heater furnace 31 before deposition, the deposition is carried out by opening the gate.

Further, laser 23 and an optical system 24 are installed in the cleaning preparatory chamber 22 and it is made possible to radiate laser beam 21 from the laser to the inside of the film formation chamber 33 by a scanning means 20. A window made of a material (quartz or the like) through which laser beam 21 can be transmitted is formed in a wall partitioning the cleaning preparatory chamber 22 and the film formation chamber 33. As the scanning means 20, a galvanomirror or a polygon mirror may be used for scanning to evaporate deposited substances adhering to the inner wall of the film formation chamber and the deposition preventing shield and carry out cleaning.

In the case of cleaning in condition that no substrate is disposed, in the film formation apparatus of FIG. 3, the inner wall of the film formation apparatus and jigs installed in the inside of the film formation apparatus are heated by laser beam radiation to carry out re-sublimation. The laser beam 21 includes laser beam from laser beam source such as continuously oscillating or pulse oscillating solid laser, continuously oscillating or pulse oscillating excimer laser, Ar laser, Kr laser and the like. The above-mentioned solid laser includes one or a plurality of types selected from YAG laser, $YVO_4$ laser, YLF laser, $YAlO_3$ laser, glass laser, ruby laser, alexandrite laser, Ti:sapphire laser. Among them, pulse oscillating excimer laser and Ar laser which are enabled to enlarge the radiation surface area in radiation face by the optical system 24 are preferable.

Further, a metal mask 32a fixed in a holder adjacently to the portion (the portion shown by the dotted line in FIG. 3) where a substrate is installed is provided and a deposition source holder 36 capable of heating at independent temperature is installed under it. A deposition source is installed on the opposite to the substrate.

A material chamber 38 is a space of the deposition source holder 36 made of a conductive metal material and when the organic compound 37 in the inside is heated to the sublimation temperature ($T_3$) by the heating means [resistance generated at the time of voltage application (resistance heating)] installed in the deposition source holder, it is evaporated and deposited on the surface of the substrate.

The first shutter 39 controls the deposition of the evaporated organic compound 37. A second shutter 25 is installed between the heater furnace 31 and the first shutter 39. The second shutter 25 is a shutter for covering the deposition source until the sublimation speed from the deposition source is stabilized.

Further, a deposition preventing shield 35 for preventing adhesion of the organic compound to the inner wall of the film formation chamber at the time of deposition is installed. Also, in the surrounding of the deposition preventing shield 35, an electric heating wire 34 is provided and by the electric heating wire 34, the entire body of the deposition preventing shield 35 can be heated. At the time of deposition, the temperature ($T_1$) of the substrate is set to be lower than the temperature ($T_2$) of the deposition preventing shield and the temperature ($T_2$) of the deposition preventing shield is set to be lower than the temperature ($T_3$) of the deposition source. Further, the temperature ($T_2$) of the deposition preventing shield is set to be higher the temperature ($T_1$) of the substrate by at least 10° C., so that an organic compound which cannot be deposited on the substrate can adhere to the substrate.

Further, the film formation chamber 33 is connected to a vacuum discharge treatment chamber for vacuum evacuating the film formation chamber. The film formation chamber 33 is also connected to a gas introduction system for restoring a normal pressure in the film formation chamber.

Further, also in the apparatus of FIG. 3, heating treatment in vacuum during the film formation can be carried out by the heater furnace 31. Since the deposition material at the time of deposition is probably contaminated with impurities such as oxygen, water and the like, it is effective to carry out heating treatment in vacuum during the deposition to emit gases contained in the film. In such a manner, while the substrate being heated in vacuum, deposition is carried out to form a film with a desired film thickness and consequently, an organic compound layer with a high density and a high purity can be formed.

By employing the film formation apparatus shown in FIG. 3, it is made possible to carry out annealing in vacuum before film formation, annealing in vacuum during film formation, and annealing in vacuum after film formation to result in improvement of the throughput.

The above-mentioned cleaning by laser beam may be carried out every film formation process and also may be carried out after a plurality of film formation processes are carried out.

This embodiment can be optionally combined with the embodiment 1.

Embodiment 3

Figure 13:
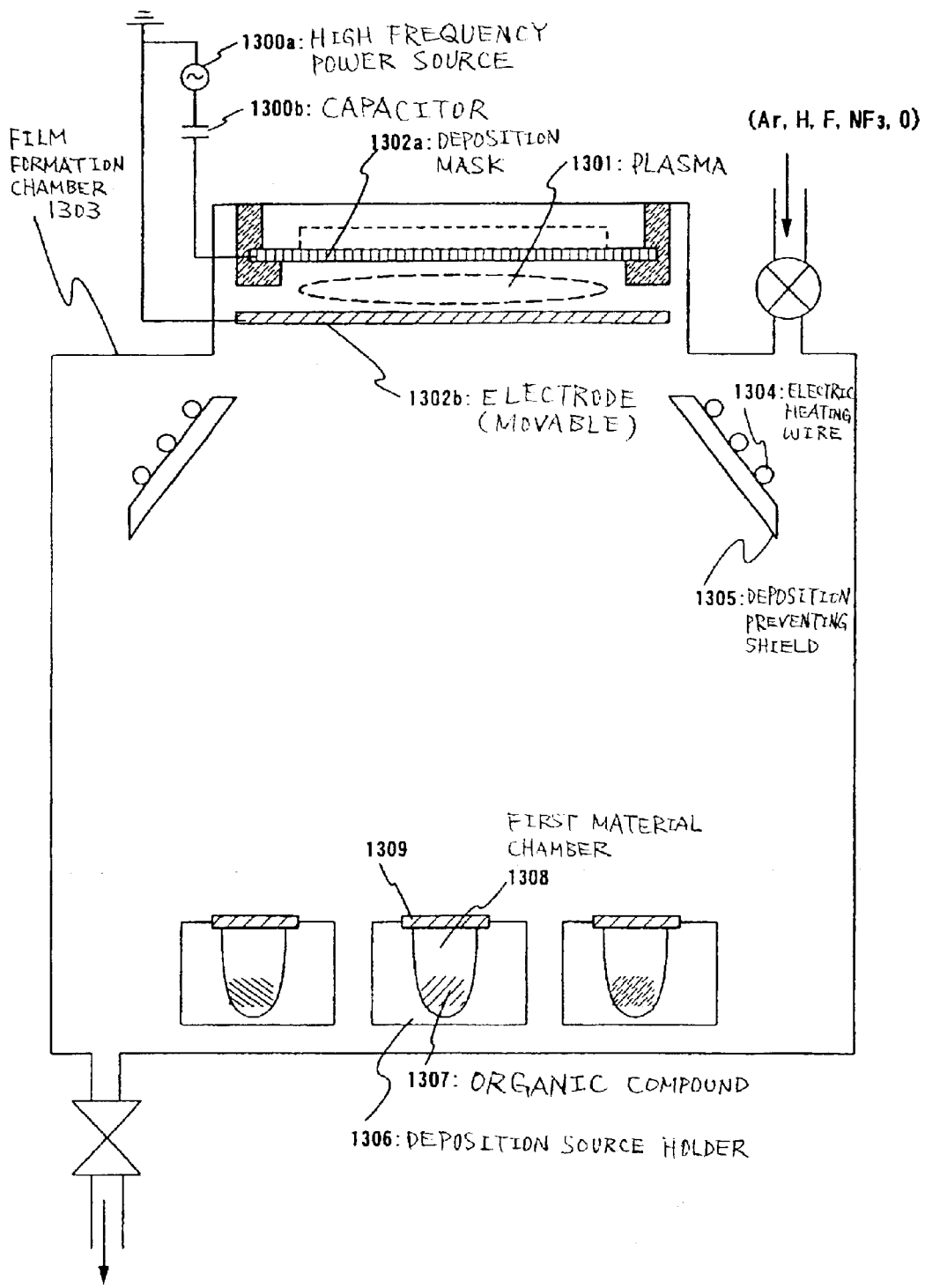
FIG. 13 shows a film formation apparatus of the invention (Embodiment 3).

The constitution of another film formation apparatus of the invention will be described with the reference to FIG. 13. FIG. 13 shows an example of a cross-sectional view of another film formation apparatus of the invention.

As shown in FIG. 13, an example in which plasma 1301 is generated between a deposition mask 1302a connected to a high frequency power source 1300a through a capacitor 1300b and an electrode 1302b will be described.

The deposition mask 1302a fixed in a holder is installed adjacently to the portion (the portion shown by the dotted line in the figure) where a substrate is to be installed and a deposition source holder 1306 capable of heating at respective temperature is installed under it. A deposition source is installed on the opposite to the substrate.

Further, a material chamber 1308 is a space of the deposition source holder 1306 made of a conductive metal material and when the organic compound 1307 in the inside is heated to the sublimation temperature ($T_3$) by the heating means (such as a resistance heating method) installed in the deposition holder, it is evaporated and deposited on the surface of the substrate. Incidentally, at the time of deposition, the electrode 1302b is moved to the position where the deposition is not disturbed.

A deposition preventing shield 1305 for preventing the organic compound from depositing on the inner wall of the film formation chamber at the time of deposition is installed. Further, an electric heating wire 1304 is laid adjacently to the surrounding of the deposition preventing shield 1305 and the entire body of the deposition preventing shield 1305 can be heated by the electric heating wire 1304. At the time of the deposition, the temperature ($T_1$) of the substrate is set to be lower than the temperature ($T_2$) of the deposition preventing shield and the temperature ($T_2$) of the deposition preventing shield is set to be lower than the temperature ($T_3$) of the deposition source. Further, the temperature ($T_2$) of the deposition preventing shield is set to be higher than the temperature ($T_1$) of the substrate by at least 10° C., so that an organic compound which cannot be deposited on the substrate can adhere to the substrate.

Figure 14A:
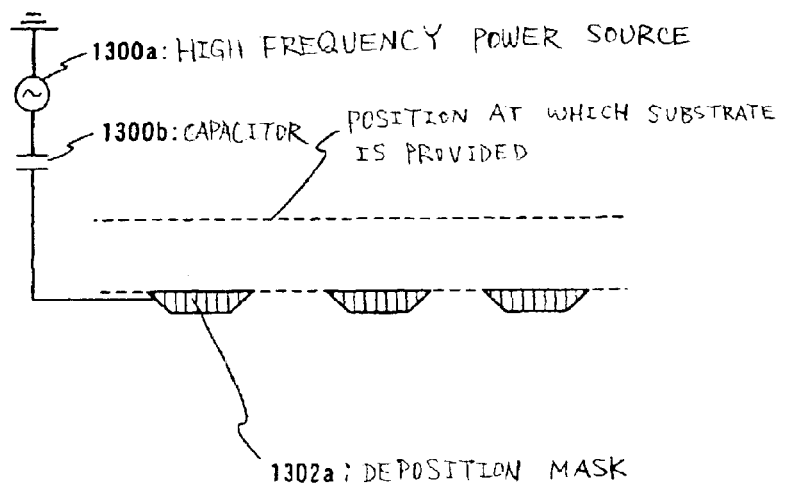
FIGS. 14A and 14B show figures showing magnified cross-sectional views of deposition masks.
Figure 14B:
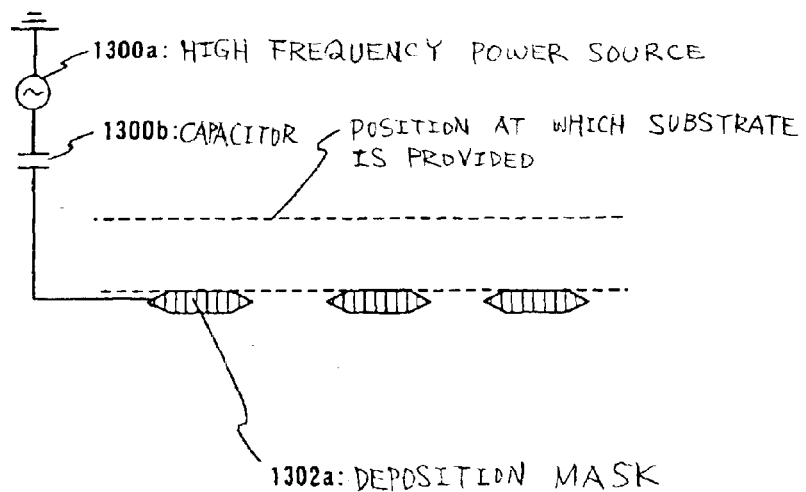

FIG. 14A shows a magnified cross-sectional view of the deposition mask 1302a. Since the deposition mask is a metal mask, at the time of processing by etching technique, the cross-section is not vertical but tapered. FIG. 14B shows an example with a different cross-sectional structure of the deposition mask. In both cross-sectional structures, the peripheral parts of the openings are sharp. Therefore, plasma can be easily generated in the peripheral parts of the openings and due to that, the portions where adhering substances are required to be cleaned out most, that is, the peripheral parts of the openings where the mask precision is decreased in the case where the adhering substances are adhered to can be cleaned out. As a method for producing the metal mask other than the etching technique, an electroforming technique is available and in this case, the cross-sectional shape becomes an overhung shape having R in the cross-section.

On completion of deposition, the substrate is taken out and then cleaning is carried out to remove deposition materials adhering to jigs installed in the inside of the film formation apparatus and to the inner wall of the film formation apparatus without exposing them to the atmospheric air. At the time of the cleaning, the electrode 1302b is moved to the position on the opposite to the deposition mask 1302a. Further, the gas is introduced into the film formation chamber 1303. The gas to be introduced into the film formation chamber 1303 may be one or a plurality of types of gases selected from Ar, H, F, $NF_3$, and O. Next, a high frequency electric field is applied to the deposition mask 1302a from the high frequency power source 1300a to excite the gas (Ar, H, F, $NF_3$, or O) and generate plasma 1301. In such a manner, plasma 1301 is generated in the film formation chamber 1303 and the deposited substances adhering to the inner wall of the film formation chamber, the deposition preventing shield 1305, and the deposition mask 1302a are evaporated and discharged outside of the film formation chamber. By the film formation apparatus shown in FIG. 13, cleaning can be carried out at the time of maintenance without opening the film formation chamber to the atmospheric air.

In this case, although the example in which plasma is generated between the deposition mask 1302a and the electrode 1302b installed between the mask and the deposition source holder 1306 is exemplified, the invention is not limited to that but include any as long as it comprises a plasma generation means. Further, a high frequency power source may be connected to the electrode 1302b and the electrode 1302b may be formed to be a mesh type electrode or an electrode just like a shower head into which a gas can be introduced.

Further, the above-mentioned cleaning by plasma may be carried out every film formation process and also may be carried out after a plurality of film formation processes are carried out.

This embodiment can be optionally combined with the embodiment 1.

The invention with the above constitution will be described further in details in accordance with the examples below.

EXAMPLES

Example 1

In this example, production of an element in which mobility of a carrier is improved by moderating the energy barrier existing in organic compound films and simultaneously functions of a plurality of types of materials are provided as well as functions of the layered structure are separated will be exemplified.

Regarding the moderation of the energy barrier in the layered structure, a technique to insert a carrier injection layer is found remarkably effective. That is, in an interface of the layered structure with a high energy barrier, a material which moderates the energy barrier is inserted, so that the energy barrier can be designed in the form of steps. Consequently, the carrier injection capability from an electrode can be increased and the driving voltage can be surely decreased to a certain extent. However, there is a problem that increase of the number of the layers contrarily results in increase of the number of the organic interfaces. That is supposed to be a reason for that an apparatus with a single layer structure has the top data of the driving voltage and power efficiency. In other words, if the such a point is solved, while the advantages (a variety of materials can be used in combination and complicated molecular designs are not required) of the layered structure being made effective, the driving voltage and the power efficiency which the single structure has can be achieved.

In this example, in the case an organic compound film composed of a plurality of functional regions is formed between an anode and a cathode of a light emitting element, unlike a conventional layered structure having clear interfaces, a structure having a mixed region containing both of a material forming a first functional region and a material forming a second functional region between the first functional region and the second functional region is formed.

By forming such a structure, the energy barrier existing among the functional regions is lowered as compared with that in the conventional structure and thus it is supposed that the carrier injection capability is improved. That is, the energy barrier among the functional regions can be moderated by forming the mixed region. Accordingly, the driving voltage can be lowered and the brightness deterioration can be suppressed.

As described above, in this example, regarding production of a light emitting element comprising at least a region (a first functional region) in which a first organic compound is capable of performing the function and a region (a second functional region) in which a second organic compound different from the first organic compound forming the first functional region is capable of performing the function and a light emitting apparatus comprising the element, by employing a film formation apparatus shown in FIG. 1, a mixed region containing an organic compound forming a first functional region and an organic compound forming a second functional region between the first functional region and the second functional region is formed.

In the film formation apparatus shown in FIG. 1, an organic compound film having a plurality of functional regions is to be formed in a single film formation chamber and corresponding to that, a plurality of deposition sources are installed. A substrate in which an anode is formed is transported and set. The substrate is heated by a heating means and the temperature ($T_1$) of the substrate is adjusted to be 50 to 200° C., preferably 65 to 150° C. Further, at the time of film formation, the temperature ($T_1$) of the substrate is set to be lower than the temperature ($T_2$) of the deposition preventing shield and the temperature ($T_2$) of the deposition preventing shield is set to be lower than the temperature ($T_3$) of the deposition source.

At first, a first organic compound 17a stored in a first material chamber 18a is deposited. Incidentally, the first organic compound 17a is previously evaporated by resistance heating and scattered toward the substrate by opening a shutter 19a at the time of deposition. Consequently, a first functional region 210 shown in FIG. 4A can be formed.

While the first organic compound 17a being deposited, a shutter 19b is opened to deposit a second organic compound 17b stored in a second material chamber 18b. The second organic compound 17b is also previously evaporated by resistance heating and scattered toward the substrate by opening the shutter 19b. Here, a first mixed region 211 composed of the first organic compound 17a and the second organic compound 17b can be formed.

After a while, only the shutter 19a is closed and the second organic compound 17b is deposited. Consequently, a second functional region 212 can be formed.

In this example, although a method for forming the mixed region by simultaneously depositing two types of organic compounds is described, the mixed region may be formed between the first functional region and the second functional region by depositing the first organic compound and then depositing the second organic compound under the deposition atmosphere of the first organic compound.

Next, while the second organic compound 17b being deposited, a shutter 19c is opened to deposit a third organic compound 17c stored in a third material chamber 18c. The third organic compound 17c is also previously evaporated by resistance heating and scattered toward the substrate by opening the shutter 19c. Here, a second mixed region 213 composed of the second organic compound 17b and the third organic compound 17c can be formed.

After a while, only the shutter 19b is closed and the third organic compound 17c is deposited. Consequently, a third functional region 214 can be formed.

Finally, a cathode is formed to complete the light emitting element by the film formation apparatus of the invention.

Further, as another organic compound film, as shown in FIG. 4B, after the first functional region 220 is formed using the first organic compound 17a, the first mixed region 221 composed of the first organic compound 17a and the second organic compound 17b is formed and further the second functional region 222 is formed using the second organic compound 17b. Successively, the second mixed region 223 is formed during the formation of the second functional region 222 by simultaneously depositing the third organic compound 17c by temporarily opening the shutter 19c.

After awhile, the shutter 19c is closed and again the second functional region 222 is formed. Finally, a cathode is formed to complete the light emitting element.

Since the film formation apparatus of FIG. 1 capable of forming the above-mentioned organic compound film can form the organic compound film having a plurality of functional regions in a single film formation chamber, the interfaces of the functional regions are not polluted with impurities and also mixed regions can be formed in the interfaces of the functional regions. In the above-mentioned manner, a light emitting element having no clear layered structure (that is, no clear organic interface) and provided with a plurality of functions can be formed.

Further, the film formation apparatus of FIG. 1 is capable of carrying out vacuum annealing before film formation, during film formation, and after film formation, and by carrying out vacuum annealing during film formation, the molecules in the mixed regions are well fitted. Accordingly, the driving voltage can be decreased and the brightness deterioration can be suppressed further. By annealing (degassing) after film formation, the impurities such as oxygen, water and the like in the organic compound layer formed on the substrate are further removed and the organic compound layer with a high density and a high purity can be formed.

This example can be optionally combined with the embodiment 1, the embodiment 2, or the embodiment 3.

Example 2

The constitution of a film formation apparatus of this example will be described in accordance to FIG. 5. FIG. 5A is an upper face view of the film formation apparatus and FIG. 5B is a cross-sectional view. Common symbols are assigned to common parts. In this example, formation of three types of organic compound films (red, green, and blue) in three film formation chambers of an in-line type film formation apparatus comprising these three film formation chambers will be exemplified. Incidentally, a first film formation chamber 305, a second film formation chamber 308, and a third film formation chamber 310 are corresponding to the film formation chamber 13 shown in FIG. 1.

In FIG. 5A, numeral 300 denotes a load chamber and after the load chamber is vacuum evacuated to decrease the pressure, the substrate installed in the load chamber is transported to a first transportation chamber 301. In the first transportation chamber 301, metal masks 303 previously fixed in holders 302 are aligned in respective holders and the substrate 304 before the deposition is mounted on the metal mask 303, for which alignment is finished. Consequently, the substrate 304 and the metal mask 303 are united and transported to first film formation chamber 305. Further, in this example, a vacuum discharge means and a heating means for the substrate are installed in the first transportation chamber 301 to carry out vacuum annealing before the deposition and remove water contained in the substrate. Further, the reversing mechanism for the substrate may be installed in the first transportation chamber 301.

The holder 302 comprises a mask holder, a shaft, a substrate holder, a control mechanism, auxiliary pins and the like. The metal mask 303 is fixed while being matched with the projections on the mask holder and the substrate 304 is mounted on the metal mask 303. The substrate 304 on the metal mask 303 is fixed by the auxiliary pins.

On completion of the alignment of the metal mask 303, the shaft is moved to z-axis direction to move the metal mask 303 again and the metal mask 303 and the substrate 304 are fixed by the auxiliary pins, so that the alignment of the metal mask 303 and the positioning conformation of the metal mask 303 and the substrate 304 can be completed. Incidentally, although the case of positioning conformation by pin-alignment method is described here, positioning conformation may be carried out by CCD alignment method using a CCD camera.

Further, at the time of transporting the substrate from the first transportation chamber 301 to the first film formation chamber 305, it is preferable to keep the substrate from the atmospheric air and to maintain the vacuum degree. Accordingly, before the substrate transportation, the first film formation chamber 305 is made to be vacuum of the extent as same as that of the first transportation chamber 301 by the vacuum discharge means.

In FIG. 5, the first film formation chamber 305 is provided with a plurality of deposition sources 306. Each deposition source 306 is composed of a material chamber (not illustrated) for storing an organic compound and a shutter (not illustrated) for controlling the scattering of the organic compound evaporated in the material chamber to the outside of the material chamber by opening or closing. Further, the first film formation chamber 305 is provided with a substrate heating means. Further, although it is not illustrated, a mechanism for aligning the substrate heating means and the metal mask 303 (including the substrate) is also installed.

A plurality of the deposition sources 306 installed in the first film formation chamber 305 contain organic compounds having respectively different functions and composing the organic compound films of a light emitting element.

In the first film formation chamber 305, the organic compounds stored in these deposition sources are successively deposited by the method described in the embodiment 1 or the example 1 to form a first organic compound film (in this case, red) having a plurality of functional regions. At the time of deposition, in order to improve the evenness of the obtained thin film in the substrate face, film formation is carried out while the substrate 304 being rotated.

Next, the substrate 304 is transported to a second transportation chamber 307. At the time of transporting the substrate from the first film formation chamber 305 to the second transportation chamber 307, it is preferable to keep the substrate from the atmospheric air and to maintain the vacuum degree. In the case of using a metal mask with the same opening pattern, in the second transportation chamber 307, the substrate 304 and the metal mask 303 are separated from each other once and then moved so as to carry out proper positioning for the film formation of the second organic compound film and the metal mask 303 may be aligned again. After that, on completion of the alignment, the substrate 304 and the metal mask 303 are again overlaid and fixed. In the case of using a metal mask with a different pattern, a new mask is previously made ready and alignment with the substrate may be carried out in the second transportation chamber or the second film formation chamber.

Then, the substrate 304 is transported to the second film formation chamber 308. At the time of transporting the substrate from the second transportation chamber 307 to the second film formation chamber 308, it is preferable to keep the substrate from the atmospheric air and to maintain the vacuum degree. The second film formation chamber is also provided with a plurality of deposition sources and substrate heating means and in the same manner in the first film formation chamber 305, a plurality of organic compounds are successively used and deposited to form a second organic compound film (in this case, green) having a plurality of functional regions.

Further, the substrate 304 is transported to a third transportation chamber 309. At the time of transporting the substrate from the second film formation chamber 308 to the third transportation chamber 309, it is preferable to keep the substrate from the atmospheric air and to maintain the vacuum degree. In the case of using a metal mask with the same opening pattern, in the third transportation chamber 309, the substrate 304 and the metal mask 303 are separated from each other once and then moved so as to carry out proper positioning for the film formation of the third organic compound film and the metal mask 303 may be aligned again. After that, on completion of the alignment, the substrate 304 and the metal mask 303 are again overlaid and fixed. In the case of using a metal mask with a different pattern, a new mask is previously made ready and alignment with the substrate may be carried out in the third transportation chamber or the third film formation chamber.

Then, the substrate 304 is transported to the third film formation chamber 310. At the time of transporting the substrate from the third transportation chamber 309 to the third film formation chamber 310, it is preferable to keep the substrate from the atmospheric air and to maintain the vacuum degree. The third film formation chamber is also provided with a plurality of deposition sources and substrate heating means and in the same manner in other formation chambers, a plurality of organic compounds are successively used and deposited to form a third organic compound film (in this case, blue) having a plurality of functional regions.

Then, the substrate 304 is transported to an annealing chamber 312. At the time of transporting the substrate from the third film formation chamber 310 to the annealing chamber 312, it is preferable to keep the substrate from the atmospheric air and to maintain the vacuum degree. After the transportation of the substrate to the annealing chamber 312, annealing in vacuum is carried out. After deposition and the vacuum degree is further increased than the vacuum degree at the time of the deposition, annealing at 100 to 200° C. is preferably carried out. By the annealing (degassing) the impurities such as oxygen, water and the like in the organic compound layer formed on the substrate are further removed to form an organic compound layer with a high density and a high purity. Further, reverse mechanism of the substrate may be provided in anneal chamber 312.

Finally, the substrate 304 is transported to an unload chamber 311 and after an inert gas is introduced to restore a normal pressure, the substrate is taken out of the film formation apparatus.

After an inert gas is introduced in the anneal chamber 312 to restore a normal pressure, the annealing may be carried out. After annealing is carried out in vacuum in the annealing chamber 312, an inert gas may be introduced in the anneal chamber 312 to restore a normal pressure.

In such a manner, by carrying out alignment of the metal masks 303 every time after formation of different organic compound films in the respective transportation chambers (or film formation chambers), a plurality of organic compound films can be formed in a single apparatus while the vacuum degree being maintained. As described above, since functional regions forming one organic compound film can be formed in a single film formation chamber, contamination with impurities among the functional regions can be avoided. Further, since this film formation apparatus is capable of forming mixed regions between neighboring functional regions, a light emitting element having a plurality of functions without clear layer structure can be produced.

Although the apparatus which carries out formation of the organic compound films is described in this example, the film formation apparatus of the invention is not limited to those with this constitution but includes those comprising a film formation chamber for forming a cathode on the organic compound films and a treatment chamber capable of sealing the light emitting element. The order of the formation of the organic compound films having the red, green, and blue luminescence may be inconsecutive.

Further, a means for cleaning the transportation chambers and the film formation chambers shown in this example may be installed. A cleaning preparatory chamber 22 as shown in FIG. 3 may be also installed.

Further, a mask preparatory chamber for storing used deposition masks and un-used deposition masks may be installed in the respective transportation chambers and the respective film formation chambers.

This example may be optionally combined with embodiment 1, embodiment 2, embodiment 3, or example 1.

Example 3

In Example 2, an example of apparatus that forms up through the organic compound film is described. In this example, an explanation will be given of the case where the apparatus that conducts to the sealing of the present invention is the inline scheme, with reference to FIG. 6.

In FIG. 6, reference numeral 501 denotes a load chamber, from which a substrate is transported. Note that the term substrate as used in this example is to be understood to mean the one with either an anode or cathode (anode used in this example) for use as one electrode of a light emitting element being formed thereon. In addition the load chamber 501 comes with a gas exhaust system 500a, wherein this exhaust system 500a is constituted including a first valve 51, a turbo molecular pump 52, a second valve 53, a third valve 54 and a dry pump 55.

Additionally in this example, as the material used for inside of respective processing chambers such as a gate-blocked load chamber, an alignment chamber, a deposition chamber, a sealing chamber and an unloading chamber, a material such as aluminum or stainless steel (SUS) with mirror surfaces through treatment of electro polishing is used on the internal wall planes thereof due to its capability to reduce an adsorption of the impurity such as oxygen and water by making surface area of the inside wall smaller. In addition, internal members made of material such as ceramics or else are employed as the inside material which are treated that pores become extremely less. Note that these materials have surface smoothness with the center average roughness being less than or equal to 30 Å.

Although the first valve 51 is a main valve having a gate valve, a butterfly valve that functions also as a conductance valve will alternatively be used. The second valve 53 and the third valve 54 are fore valves. First, a pressure of the load chamber 501 is roughly reduced by the dry pump 55 with the second valve 53 opened, next, a pressure of the load chamber 501 is reduced to a high degree of vacuum by the turbo molecular pump 52 with the first valve 51 and third valve 54 open. Note that the turbo molecular pump may be replaced with a mechanical booster pump; alternatively, the turbo molecular pump is usable after increased the vacuum degree by the mechanical booster pump.

Next, the one indicated by numeral 502 is an alignment chamber. Here, alignment of a metal mask and positioning of a substrate on the metal mask are done for deposition at a deposition chamber to which it will next be transferred.

The alignment chamber 502 may be equipped with an inversion mechanism of a substrate. Additionally, the method explained in FIG. 5 may be employed in the alignment method here. Additionally the alignment chamber A502 comprises a gas exhaust system 500b and is shut and shielded from the load chamber 501 by a gate, not shown.

Further, the alignment chamber A502 is provided with a cleaning preliminary chamber 513a to thereby enable of cleanup at the alignment chamber A502. Note that the used metal mask can be cleanup by providing the metal mask in the alignment chamber A502 in advance.

Next, numeral 503 denotes a deposition chamber for fabrication of a first organic compound layer by vacuum evaporation methods, which will be called deposition chamber A503 hereinafter. The deposition chamber A503 comprises an exhaust system 500c. In addition, this is shut and shielded from the alignment chamber A502 by a gate, not shown.

In a similar way to the alignment chamber A502, the deposition chamber A503 is provided with a cleaning preliminary chamber 513b.

In this example, a deposition chamber that has the structure shown in FIG. 1 is provided as the deposition chamber A503 for fabrication of the first organic compound layer which emits red light. Additionally provided as the evaporation sources are a first evaporation source provided with an organic compound with hole injectability, a second evaporation source provided with an organic compound with hole transportability, a third evaporation source provided with an organic compound with hole transportability for use as a host of organic compound with luminescent ability, a fourth evaporation source provided with an organic compound with luminescent ability, a fifth evaporation source provided with an organic compound with blocking ability, and a sixth evaporation source provided with an organic compound with electron transportability.

It is also noted that in this example, copper phthalocyanine (abbreviated as "Cu—Pc" hereinafter) is used as the organic compound with hole injectability that provided in the first evaporation source; 4,4'-bis [N-(1-naphthyl)-N-phenyl-amino]-biphenyl (abbreviated as "α-NPD" hereafter) is used as the organic compound with hole transportability being provided in the second evaporation source; 4,4'-dicarbazole-biphenyl ("CBP") is used as the organic compound which becomes the host provided in the third evaporation source; 2,3,7,8,12,13,17,18-octaethyl-21H, 23H-porphyrin-platinum ("PtOEP") is used as the organic compound with luminescent ability provided in the fourth evaporation source; bathocuproin ("BCP") is used as the organic compound with blocking ability provided in the fifth evaporation source; and, tris (8-quinolinolat) aluminum ("Alq$_3$") is used as the organic compound with electron transportability provided in the sixth evaporation source.

It is noted that the organic compound layer comprising regions having the functions of hole injectability, hole transportability, luminescent ability, and electron transportability can be formed over the anode by depositing these organic compound in order through a vacuum evaporation.

Also note that in this example, a mixed region is formed at an interface between different function regions by simultaneous vacuum evaporation of organic compounds consisting of both function regions. To be brief, mixed regions are formed respectively at an interface between the hole injection region and the hole transport region and at an interface between the hole transport region and the electron transport region including a luminescent region.

Practically, after formed a first function region through deposition of Cu—Pc to a thickness of 15 nm, both Cu—Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and CBP. Thereafter, fabricate a film of CBP to a thickness of 25 to 40 nm, thus forming a third function region. At the step of forming the third function region, both CBP and PtOEP are deposited at a same time, thereby forming a third mixed region at the entirety or part of the third function region. Note here that the third mixed region has luminescent ability. Further, both CBP and BCP are deposited by simultaneous vacuum evaporation to a film thickness of 5 to 10 nm, thereby forming a fourth mixed region. In addition, a BCP film is fabricated to a thickness of 8 nm, thus forming a fourth function region. Furthermore, BCP and $Alq_3$ are deposited by simultaneous vacuum evaporation to a film thickness of 5 to 10 nm, resulting in formation of a fifth mixed region. Lastly a film of $Alq_3$ is formed to a thickness of 25 nm, thus enabling formation of a fifth function region. With the above process steps, a first organic compound layer is thus formed.

It should be noted that in the above explanation concerning the first organic compound layer six kinds of organic compounds different in function from one another are provided in six evaporation sources respectively and the organic compound layer is then formed by vacuum evaporation of these organic compounds. This example should not be limited only to the above and may use a plurality of organic compounds. Additionally the organic compound provided in a single evaporation source should not always be limited to a single one and may alternatively be multiple ones. For example, in addition to a single kind of material provided in an evaporation source as an organic compound with luminescent ability, another organic compound that serve as a dopant may be provided together. Note that the first organic compound layer has a plurality of functions and prior known materials may be used as these organic compounds composing an organic compound layer which emits the red light.

It is to be noted that the evaporation sources may be designed so that a microcomputer is used to control the deposition speeds thereof. Additionally, with this arrangement, it is preferable to control the ratio of mixture upon simultaneous fabrication of a plurality of organic compound layers.

Next, the one indicated by numeral 506 is an alignment chamber. Here, alignment of a metal mask and positioning of a substrate on the metal mask are done for deposition at a deposition chamber to which it will next be transferred. The alignment may be done in the deposition chamber 507. Additionally the alignment chamber B506 comprises a gas exhaust system 500*d* and is shut and shielded from the deposition chamber A503 by a gate not shown. It further comprises a cleaning preliminary chamber 513*c* that is shut and shielded from the alignment chamber B506 by a gate not shown, in a similar way to the alignment chamber A502.

Next, numeral 507 denotes a deposition chamber for fabrication of a second organic compound layer by vacuum evaporation, which will be called the deposition chamber B507. This deposition chamber B507 is provided with an exhaust system 500*e*. In addition it is shut and shielded from the alignment chamber B506 by a gate, not shown. Further, it comprises a cleaning preliminary chamber 513*d* which is shut and shielded from the deposition chamber B507 by a gate not shown, in a similar way to the deposition chamber A503.

In this example a deposition chamber with the structure shown in FIG. 1 is provided as the deposition chamber B507 for fabrication of a second organic compound layer which emits green light. Additionally provided as the evaporation sources are a first evaporation source provided with an organic compound with hole injectability, a second evaporation source and a third evaporation source each provided with organic compounds with hole transportability, a fourth evaporation source provided with a host material with hole transportability, a fifth evaporation source provided with an organic compound with luminescent ability, a sixth evaporation source provided with an organic compound with blocking ability, and a seventh evaporation source provided with an organic compound with electron transportability.

It is noted that in this example, Cu—Pc is employed as the organic compound with hole injectability provided in the first evaporation source; MTDATA is employed as the organic compound with hole transportability provided in the second evaporation source; α-NPD is employed as the organic compound with hole transportability provided in the third evaporation source; CBP is employed as the host material with hole transportability provided in the fourth evaporation source; tris (2-phenylpyridine) iridium (Ir(ppy)$_3$) is employed as the organic compound with luminescent ability provided in the fifth evaporation source; BCP is employed as the organic compound with blocking ability provided in the sixth evaporation source; and, $Alq_3$ is employed as the organic compound with electron transportability provided in the seventh evaporation source.

It is noted the second organic compound layer can be formed on the anode by successive vacuum evaporation of these organic compounds, which comprises regions having functions of hole transportability, luminescent ability, blocking ability and electron transportability.

Also note that in this example, a mixed region is formed at an interface between different function regions by simultaneous vacuum evaporation of organic compounds forming both the function regions. More specifically, mixed regions are formed respectively at an interface between the hole transport region and the blocking region and at an interface between the blocking region and the electron transport region.

Practically, after formed a first function region through deposition of Cu—Pc to a thickness of 10 nm, both Cu—Pc and MTDATA are deposited by a vacuum evaporation at a same time to thereby form a first mixed region with a film thickness of 5 to 10 nm. Then, fabricate a film of MTDATA to a thickness of 20 nm to thereby form a second function region, followed by formation of a second mixed region with a thickness of 5 to 10 nm by simultaneous vacuum evaporation of MTDATA and α-NPD. Thereafter fabricate a film of α-NPD to a thickness of 10 nm, thereby forming a third function region. Then, by simultaneous vacuum evaporation of α-NPD and CBP, a third mixed region is formed in thickness from 5 to 10 nm. Subsequently, fabricate a film of CBP to a thickness of 20 to 40 nm to thereby form a fourth function region. At the step of forming the fourth function region, (Ir(ppy)$_3$) is deposited by simultaneous vacuum evaporation at part or entirety of the fourth function region, thus forming a fourth mixed region; then, simultaneously deposited CBP and BCP by vacuum evaporation to form a fifth mixed region with a thickness of 5 to 10 nm; next, deposit a BCP film of 10 nm thickness to thereby form a fifth function region; next, simultaneously deposit BCP and $Alq_3$ by vacuum evaporation to form a sixth mixed region with a film thickness of 5 to 10 nm; lastly, form a film of $Alq_3$ to a thickness of 40 nm, thus forming a sixth function region to thereby form a second organic compound layer.

Noted that in the above explanation the organic compound layer is formed by vacuum evaporation from seven evaporation sources provided with organic compounds having different functions respectively as the second organic compound layer. This example should not be limited only to the above and is modifiable as far as a plurality of evaporation sources. Additionally prior known materials may be used as organic compounds with a plurality of functions for forming an organic compound layer which emits green light.

Next, the one indicated by numeral 508 is an alignment chamber. Here, alignment of a metal mask and positioning of a substrate on the metal mask are done for deposition at a deposition chamber to which it will next be transferred. The alignment may be done in the deposition chamber 509. Additionally the alignment chamber C508 comprises a gas exhaust system 500$f$ and is shut and shielded from the deposition chamber B507 by a gate not shown. It further comprises a cleaning preliminary chamber 513$e$ that is shut and shielded from the alignment chamber C508 by a gate not shown, in a similar way to the alignment chamber A502.

Next, numeral 509 denotes a deposition chamber for fabrication of a third organic compound layer by vacuum evaporation, which will be called the deposition chamber C509. This deposition chamber C509 is provided with an exhaust system 500$g$. In addition it is shut and shielded from the alignment chamber C508 by a gate not shown. Further, it comprises a cleaning preliminary chamber 513$f$ which is shut and shielded from the deposition chamber C509 by a gate not shown, in a similar way to the alignment chamber A503.

In this example a deposition chamber with the structure shown in FIG. 1 is provided as the deposition chamber C509 for fabrication of a third organic compound layer which emits blue light. Additionally provided as the evaporation sources are a first evaporation source provided with an organic compound with hole injectability, a second evaporation source provided with organic compound with luminescent ability, a third evaporation source provided with blocking ability, a fourth evaporation source provided with an organic compound with electron transportability.

It is noted that in this example, Cu—Pc is employed as the organic compound with hole injectability provided in the first evaporation source; α-NPD is employed as the organic compound with luminescent ability provided in the second evaporation source; BCP is employed as the organic compound with blocking ability provided in the third evaporation source; and, Alq$_3$ is employed as the organic compound with electron transportability provided in the fourth evaporation source.

It is noted the third organic compound layer can be formed over the anode by successive vacuum evaporation of these organic compounds, which comprises regions having functions of hole injectability, luminescent ability, blocking ability and electron transportability.

Also note that in this example, a mixed region is formed at an interface between different function regions by simultaneous vacuum evaporation of organic compounds forming both the function regions. More specifically, mixed regions are formed respectively at an interface between the hole injection region and the light emitting region, the light emitting region and the blocking region, and the blocking region and the electron transport region.

Practically, after formed a first function region through deposition of Cu—Pc to a thickness of 20 nm, both Cu—Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and BCP. Thereafter fabricate a film of BCP to a thickness of 10 nm, thereby forming a third function region. Then, by simultaneous vacuum evaporation of BCP and Alq$_3$, a third mixed region is formed in thickness from 5 to 10 nm; lastly, form a film of Alq$_3$ to a thickness of 40 nm, to thereby form a third organic compound layer.

Noted that in the above explanation the organic compound layer is formed by successive vacuum evaporation from fourth evaporation sources provided with four organic compounds having different functions respectively as the third organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Note that prior known materials may be used as organic compounds with a plurality of functions for forming an organic compound layer which emits blue light.

Additionally in this example, one specific case has been explained where the organic compound layer which emits red light is formed in the first deposition chamber A503 while forming the organic compound layer which emits green light in the second deposition chamber B507 and also forming the organic compound layer which emits blue light in the third deposition chamber C509. However, the order of formation of these layers should not be limited only the above order. One of the organic compound layers which emit lights of red, green, and blue, respectively may be formed within one of the deposition chamber A503, deposition chamber B507, and deposition chamber C509. Still alternatively, an additional deposition chamber may be provided for forming an organic compound layer which emits white light therein.

An annealing furnace may be provided to anneal the organic compound film with vacuum after the deposition of the organic compounds. By the annealing after the deposition, oxygen and water in the organic compound layer formed on the substrate is removed further so that high-density and high-purity organic compound layer may be formed.

Next, numeral 510 denotes a deposition chamber for formation of a conductive film being either the anode or the cathode of a light emitting element (a metal film used as the cathode in this example) by vacuum evaporation, which will be called the deposition chamber D510. The deposition chamber D510 comprises an exhaust system 500$h$, in addition, is shut and shielded from the deposition chamber C509 by a gate not shown. Further, it comprises a cleaning preliminary chamber 513$g$ which is sealed and shielded from the deposition chamber D510 by a gate not shown, in a similar manner to that of the deposition chamber A503.

In this example a deposition chamber with the structure shown in FIG. 1 is provided as the deposition chamber D510. Accordingly, in regard to a detailed operation of the deposition chamber D510, refer to the explanation of FIG. 1.

In this example, in the deposition chamber D510, an Al—Li alloy film (film made of an alloy of aluminum and lithium) is deposited as the conductive film used as the cathode of the light emitting element. Additionally it will also possible to employ co-vacuum evaporation of aluminum and an element belonging to either the group I or group II of the periodic table.

Alternatively a CVD chamber may be provided here for formation of an insulating film such as a silicon nitride film, silicon oxide film and DLC film or else as a protective film (passivation film) of the light emitting element. Note that in the case of providing such CVD chamber, it will be preferable that a gas purifying machine be provided for increasing in advance the purity of a material gases used in the CVD chamber.

Next, numeral 511 denotes a sealing chamber, which comprises an exhaust system 500i. In addition, it is shut and shielded from the deposition chamber D510 by a gate not shown. In the seal chamber 511, processing is to be done for finally enclosing a light emitting element in a sealed space. This processing is the treatment for protecting the light emitting element formed against oxygen and water, and employs a means for mechanically enclosing it by a cover material or alternatively for enclosing it by either thermally hardenable resin or ultraviolet-ray hardenable resin material.

While the cover material used may be glass, ceramics, plastic or metal, the cover material must have optical transmissivity in cases where light is emitted toward the cover material side. Additionally the cover material and a substrate with the above-stated light emitting element formed thereon are adhered together by use of a seal material such as thermal hardenable resin or ultraviolet-ray hardenable resin or else, thereby forming an air-tight sealed space by letting the resin be hardened through thermal processing or ultraviolet ray irradiation processing. It is also effective to provide in this sealed space a moisture absorbable material, typical example of which is barium oxide.

It will also be possible to fill the space between the cover material and the substrate having the light emitting element formed thereon with either thermal hardenable resin or ultraviolet-ray hardenable resin. In this case, it is effective to add a moisture absorption material typically such as barium oxide into either the thermal hardenable resin or ultraviolet-ray hardenable resin.

In the deposition apparatus shown in FIG. 6, a mechanism for irradiation of ultraviolet light to the interior of the seal chamber 511 (referred to as the "ultraviolet light irradiation mechanism" hereinafter) is provided, which is arranged so that ultraviolet light as emitted from this ultraviolet light irradiation mechanism is used to harden the ultraviolet-ray hardenable resin.

Lastly, numeral 512 is an unload chamber, which comprises an exhaust system 500j. The substrate with light emitting element formed thereon will be taken out of here.

As described the above, by using the deposition apparatus shown in FIG. 6 or FIG. 1, exposure of the light emitting element to the outside air is avoided until the light emitting element is completely enclosed in the sealed space. Thus, it is possible to manufacture a luminescent device with high reliability.

This example may be freely combined with Embodiment 1 to 3, Examples 1, or Example 2.

Example 4

Figure 7:
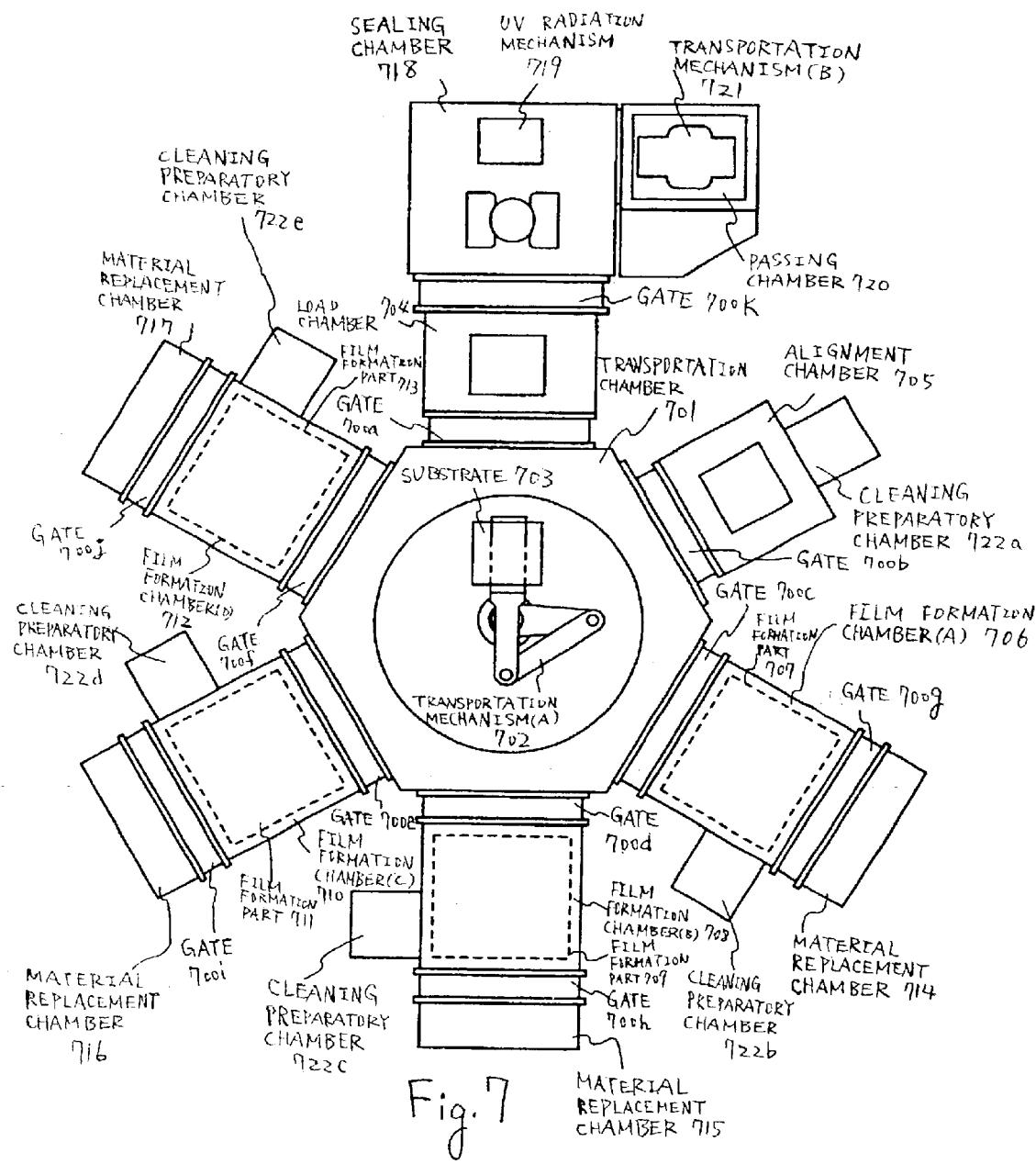
FIG. 7 shows a figure illustrating a film formation apparatus of the invention (Example 4).

Another film formation apparatus of the invention will be described with the reference to FIG. 7. In FIG. 7, the numeral 701 denotes a transportation chamber and the transportation chamber 701 is provided with a transportation mechanism (A) 702 and transports a substrate 703. The transportation chamber 701 is controlled to be in decreased pressure atmosphere and connected with respective treatment chambers through gates. Sending and receiving a substrate to and from the respective chambers is carried out by the transportation mechanism (A) 702 when the gates are opened. Further, to decrease the pressure in the transportation chamber 701, a gas evacuation pump such as a dry pump, mechanical booster pump, turbo-molecular pump (a magnetically floating type) or a cryopump can be employed and in order to produce highly vacuum state with a high purity, the magnetically floating type turbo-molecular pump is preferable.

Hereinafter, the respective treatment chambers will be described. Incidentally, since the transportation chamber 701 is in decreased pressure atmosphere, the treatment chambers directly connected to the transportation chamber 701 are all equipped with gas discharge pumps (not illustrated). As the gas evacuation pumps, the above-mentioned dry pump, mechanical booster pump, turbo-molecular pump (a magnetically floating type) or cryopump can be employed and also in this case, the magnetically floating type turbo-molecular pump is preferable.

At first, the numeral 704 denotes a load chamber for carrying out setting (disposing) a substrate. The load chamber 704 is connected to the transportation chamber 701 through a gate 700a and a carrier (not illustrated) on which the substrate 703 is mounted is installed here. The load chamber 704 works also as a transportation chamber for a substrate which is passed through the element formation process to a sealing chamber. The load chamber 704 may comprise different rooms for substrate transporting in and substrate transporting out. Further, the load chamber 704 is provided with the above-mentioned gas discharge pump and a purge line for introducing nitrogen gas or a rare gas with a high purity. Turbo molecular pump is preferable for gas discharge pump. Further, the purge line is equipped with a gas refining apparatus so as to previously remove impurities (oxygen and water) from the gas to be introduced into the apparatus.

In this example, as the substrate 703, a substrate on which a transparent conductive film to be an anode of a light emitting element is employed. In this example, the substrate 703 is set on the carrier while the face to form a film thereon being face down.

Next, the numeral 705 denotes an alignment chamber for carrying out alignment of a metal mask and positioning conformation of the substrate passed through the formation of an anode or a cathode (in this case, an anode) of the light emitting element and the metal mask and the alignment chamber 705 is connected to the transportation chamber 701 through a gate 700b. Incidentally, every time different organic compound films are formed, alignment of the metal mask and positioning conformation of the substrate and the metal mask are carried out in the alignment chamber. Further, in the alignment chamber 705, a CCD (a charge coupled device) known as an image sensor is installed, so that positioning conformation of the substrate and the metal mask can be carried out at a high precision at the time of film formation using the metal mask.

Further, a cleaning preparatory chamber 722a is connected to the alignment chamber 705. The constitution of the cleaning preparatory chamber 722a is as shown in FIG. 3 and the embodiment 2. Cleaning may be carried out using a reactive gas. Alternatively, no cleaning preparatory chamber is installed and as shown in the embodiment 3, a gas (one or a plurality of types of gases selected from Ar, H, F, $NF_3$, and O) is introduced into the film formation chamber and plasma is generated in the film formation chamber to carry out dry cleaning or Ar gas or the like is introduced and physical cleaning by sputtering method may be carried out.

In the case of carrying out cleaning using the reactive gas, a $\mu$ wave oscillator for generating $\mu$ wave is installed and the $\mu$ wave generated there is transmitted to a plasma discharge tube through a waveguide. Incidentally, from the $\mu$ wave oscillator to be employed in this case, $\mu$ wave of about 2.45 GHz is radiated. Further, to the plasma discharge tube, the reactive gas is supplied from a gas introduction pipe. As the reactive gases $NF_3$, $CF_4$, or $ClF_3$ may be used. The reactive gas is decomposed by the $\mu$ wave in the plasma discharge tube and radical is generated. The radical passes through the gas introduction pipe and is introduced into the alignment chamber 705 connected to through the gate. In the alignment chamber 705, a metal mask bearing an organic compound film is previously disposed. Then, the radical can be introduced into the alignment chamber 705 by opening the gate installed between the cleaning preparatory chamber 722a and the alignment chamber 705. Consequently, cleaning of the metal mask can be carried out.

Next, the numeral 706 is a film formation chamber for forming an organic compound film by a deposition method and named as a film formation chamber (A). The film formation chamber (A) 706 is connected to a transportation chamber 701 through a gate 700c. In this example, a film formation chamber with a structure shown in FIG. 1 is formed as the film formation chamber (A) 706.

In this example, in a film formation part 707 in the film formation chamber (A) 706, a first organic compound film emitting red color is formed.

By successively depositing organic compounds, an organic compound film comprising regions having functional properties of a hole injecting property, a hole transporting property, a light emitting property, and an electron transporting property can be formed.

The film formation chamber (A) 706 is connected to a material replacement chamber 714 through a gate 700g. In the material replacement chamber 714, a heater for heating the replacing organic compound is installed. Impurities such as water can be removed previously by heating the organic compound. The temperature at the time of heating is preferably 200° C. or lower. Further, since the material replacement chamber 714 is provided with a gas discharge pump capable of keeping the inside in decreased pressure, the inside is kept in decreased pressure after an organic compound is additionally supplied from the outside or exchanged and then heated. When the pressure is decreased to the same level as that of the film formation chamber, the gate 700g is opened to supplement the organic compound to the deposition source in the inside of the film formation chamber. The organic compound is thus stored in the deposition source in the film formation chamber by the transportation mechanism.

Regarding the film formation process in the film formation chamber (A) 706, the description of FIG. 1 described in the embodiment 1 and the example 1 should be referred to. Incidentally, similarly to the alignment chamber 705, a cleaning preparatory chamber 722b is connected also to the film formation chamber (A) 706 through a gate (not illustrated). The practical constitution is same as the cleaning preparatory chamber 722a and organic compound or the like adhering to the inside of the film formation chamber (A) 706 can be removed.

Next, the numeral 708 denotes a film formation chamber for forming a second organic compound film by a deposition method and named as a film formation chamber (B). The film formation chamber (B) 708 is connected to a transportation chamber 701 through a gate 700d. In this example, a film formation chamber with a structure shown in FIG. 1 is formed as the film formation chamber (B) 708. In this example, in a film formation part 709 in the film formation chamber (B) 708, an organic compound film emitting green color is formed.

By successively depositing organic compounds, an organic compound film comprising regions having functional properties of a hole transporting property, a light emitting property, a blocking property and an electron transporting property can be formed.

The film formation chamber (B) 708 is connected to a material replacement chamber 715 through a gate 700h. In the material replacement chamber 715, a heater for heating the replacing organic compound is installed. Impurities such as water can be removed previously by heating the organic compound. The temperature at the time of heating is preferably 200° C. or lower. Further, since the material replacement chamber 715 is provided with a gas discharge pump capable of keeping the inside in decreased pressure, the inside is kept in decreased pressure after an organic compound is introduced into from the outside. When the pressure is decreased to the same level as that of the film formation chamber, the gate 700h is opened to supplement the organic compound to the deposition source in the inside of the film formation chamber. The organic compound is thus stored in the deposition source in the film formation chamber by the transportation mechanism or the like.

Regarding the film formation process in the film formation chamber (B) 708, the description of FIG. 1 described in the embodiment 1 and the example 1 should be referred to. Incidentally, similarly to the alignment chamber 705, a cleaning preparatory chamber 722c is connected also to the film formation chamber (B) 708 through a gate (not illustrated).

Next, the numeral 710 denotes a film formation chamber for forming a third organic compound film by a deposition method and named as a film formation chamber (C). The film formation chamber (C) 710 is connected to a transportation chamber 701 through a gate 700e. In this example, a film formation chamber with a structure shown in FIG. 1 is formed as the film formation chamber (C) 710. In this example, in a film formation part 711 in the film formation chamber (C) 710, an organic compound film emitting blue color is formed.

By successively depositing organic compounds, an organic compound film comprising regions having functional properties of a hole injecting property, a light emitting property, a blocking property and an electron transporting property can be formed.

The film formation chamber (C) 710 is connected to a material replacement chamber 716 through a gate 700i.

Regarding the film formation process in the film formation chamber (C) 710, the description of FIG. 1 described in the embodiment 1 and the example 1 should be referred to. Incidentally, similarly to the alignment chamber 705, a cleaning preparatory chamber 722d is connected also to the film formation chamber (C) 710 through a gate (not illustrated).

Next, the numeral 712 denotes a film formation chamber for forming a conductive film to be an anode or a cathode (in this example, a metal film to be a cathode) of a light emitting element by a deposition method and named as a film formation chamber (D). The film formation chamber (D) 712 is connected to the transportation chamber 701 through a gate 700f. In this example, in a film formation part 713 in the film formation chamber (D) 712, an Al—Li alloy film (alloy film of Aluminum and Lithium) to be a conductive film of a cathode of the light emitting element is formed. Incidentally, elements belonging to group I or group II in a periodic table may be co-deposited with aluminum.

The film formation chamber (D) 712 is connected to a material replacement chamber 717 through a gate 700j. In the material replacement chamber 717, a heater for heating the replacing conductive material is installed. Incidentally, similarly to the alignment chamber 705, a cleaning preparatory chamber 722e is connected also to the film formation chamber (D) 712 through a gate (not illustrated).

Further, heating mechanism for heating the respective film formation chambers is installed in each of the film formation chamber (A) 706, the film formation chamber (B) 708, the film formation chamber (C) 710 and the film formation chamber (D) 712. Consequently, some of the impurities in the respective chambers can be removed.

Further, each of the film formation chamber (A) 706, the film formation chamber (B) 708, the film formation chamber (C) 710 and the film formation chamber (D) 712 is kept in decreased pressure by a gas discharge pump. Incidentally, the achieved vacuum degree in this case is preferably 10–6 Pa or higher and for example, amount of leakage should be $4.1 \times 10^{-7}$ $Pa.m^3/s^{-1}$ or lower for 20 hours in the case of using a cryopump of a gas discharge speed of 10,000 l/s ($H_2O$), setting the surface area 10 $m^2$ of the inside of each film formation chamber and using aluminum to form the inside of the film formation chamber.

Next, the numeral 718 denotes a sealing chamber (referred also to as a sealing chamber or a globe box) and connected to the load chamber 704 through a gate 700k. In the sealing chamber 718, a treatment for finally sealing the light emitting element in a closed space is carried out. The treatment is for protecting the formed light emitting element from oxygen and water and sealing it mechanically with a cover material or by employing means of sealing with a thermosetting resin or a UV curable resin.

As the cover material, glass, ceramics, plastics or metals may be employed, however in the case light is radiated to the cover materials side, it should be light transmissive. Further, the cover material and the substrate on which the above-mentioned light emitting element is formed are stuck to each other by using a sealing agent of a thermosetting resin or a UV curable resin and the closed space can be formed by curing the resin by heating treatment or UV radiation treatment. It is also effective to put an absorbent such as barium oxide in the closed space.

Further, the space between the cover material and the substrate on which the above-mentioned light emitting element is formed may be filled with a thermosetting resin or a UV curable resin. In such a case, it is also effective to put an absorbent such as barium oxide in the closed space.

In the film formation apparatus shown in FIG. 7, mechanism (hereinafter referred to as UV radiation mechanism) 719 for radiating UV rays is installed in the inside of the sealing chamber 718 and the UV curable resin is cured by UV rays radiated from the UV radiation mechanism 719. The inside of the sealing chamber 718 may be kept in vacuum by installing a gas discharge pump. In the case where the above-mentioned sealing process is carried out mechanically by robot operation, contamination with oxygen and water can be prevented by carrying out the process in vacuum condition. Practically the concentration of oxygen and water is preferably decreased to 0.3 ppm or lower. On the contrary, the inside of the sealing chamber 718 may be pressurized. In this case, the pressure is applied while purging with a highly pure nitrogen gas or rare gas so as to prevent penetration of oxygen from the outside air.

Next, a passing chamber (a pass box) 720 is connected to the sealing chamber 718. The passing chamber 720 is provided with a transportation mechanism (B) 721 and the substrate passed through the sealing treatment of the light emitting element in the sealing chamber 718 is transported to the passing chamber 720. The passing chamber 720 is also made to be vacuum by installing a gas discharge pump. The passing chamber 720 is a facility for inhibiting the sealing chamber 718 from direct exposure to the atmospheric air and from the chamber, the obtained substrate is taken out. Besides, a member supply chamber (not illustrated) for supplying a member to be employed in the sealing chamber may be installed.

Although it is not illustrated in this example, after the light emitting element formation, an insulating film of a compound containing silicon nitride, silicon oxide or the like or an insulating film comprising a carbon-containing DLC (diamond like carbon) layered further thereon maybe formed on the light emitting element. The DLC (diamond like carbon) film means an amorphous film in which diamond bond ($SP^3$ bond) and graphite bond ($SP^2$ bond) exist together. Further, in this case, a film formation chamber provided with a CVD (chemical vapor deposition) apparatus for forming a thin film by generating plasma by applying self-bias and decomposing raw material gases by plasma discharge may be installed.

As described above, by employing the film formation apparatus shown in FIG. 7, without being exposed to the atmospheric air, the processes can be carried out until the light emitting element is completely sealed in the closed space, so that a highly reliable light emitting apparatus can be produced.

The example can be optically combined with embodiment 1, embodiment 2, example 1 or example 2.

Example 5

Figure 8:
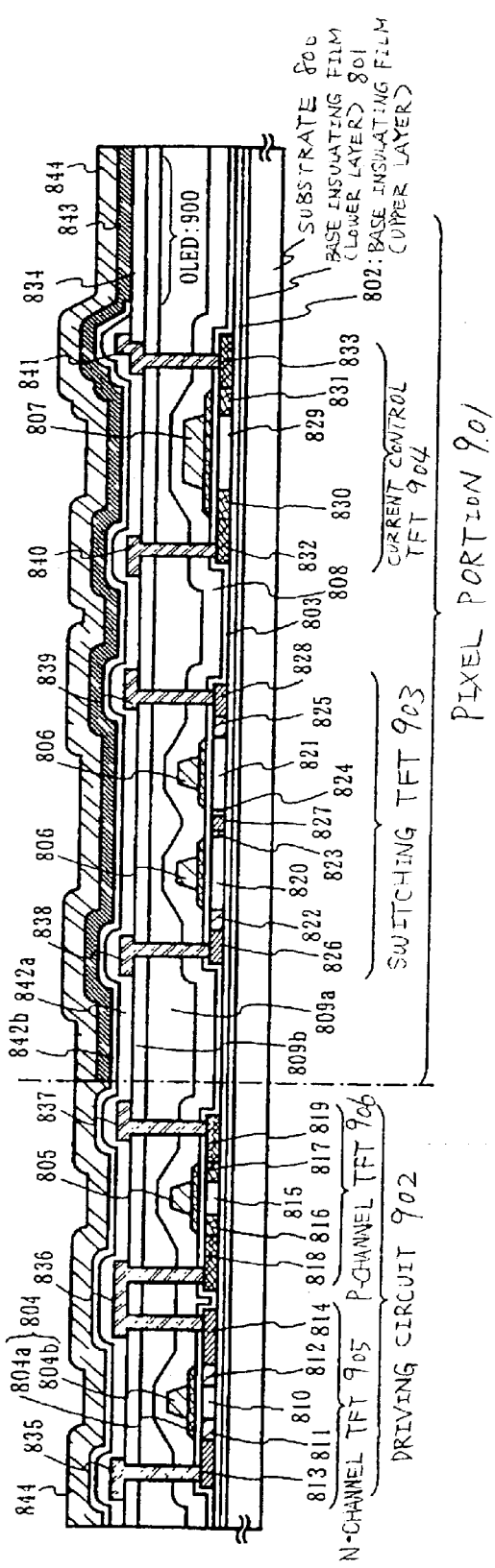
FIG. 8 shows a figure illustrating a light emitting apparatus of the invention.

Here, a detailed description will be given on a light emitting device by using the deposition apparatus of the present invention. FIG. 8 is a cross-sectional view of the active matrix type light emitting device. As an active element, a thin film transistor is used (hereinafter referred to as TFT) here, a MOS transistor may also be used.

A top gate TFT (specifically a planar TFT) is shown as an example, a bottom gate TFT (typically inversely staggered TFT) may also be used.

In this example, a substrate 800 is used, which is made of barium borosilicate glass or aluminoborosilicate glass, a quartz substrate, a silicon substrate, a metal substrate, or stainless substrate forming an insulating film on the surface may be used. A plastic substrate having heat resistance enduring a treatment temperature of this example also may be used, and further a flexible substrate may be used.

Next, a silicon oxynitride film is formed as a lower layer 801 of a base insulating film on a heat-resistant glass substrate (the substrate 800) with a thickness of 0.7 mm by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film is formed as an upper layer 802 of the base insulating film by plasma CVD at a temperature of 400° C. using $SiH_4$ and $N_2O$ as material gas (the composition ratio of the silicon oxynitride film: Si=32%, O=59%, N=7%, H=2%). The silicon oxynitride film has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film (an amorphous silicon film is used here) is 54 nm (preferably 25 to 200 nm) in thickness.

A base insulating film in this example has a two-layer structure. However, the base insulating film may be a single layer or more than two layers of insulating films mainly containing silicon. The material of the semiconductor film is not limited but it is preferable to form the semiconductor film from silicon or a silicon germanium alloy ($Si_xGe_{1-x}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dose to $2\times10^{12}$ atoms/cm$^2$.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time.

After an oxide film on the surface of the silicon film having a crystal structure is removed by diluted fluoric acid or the like, a continuous wave solid-state laser and the second to fourth harmonic of the fundamental wave are employed in order to obtain crystals of large grain size when crystallizing an amorphous semiconductor film. Since the laser light irradiation is conducted in the air or in an oxygen atmosphere, an oxide film is formed on the surface as a result. Typically, the second harmonic (532 nm) or third harmonic (355 nm) of a Nd:$YVO_4$ laser (fundamental wave: 1064 nm) is employed. When using a continuous wave laser, laser light emitted from a 10 W power continuous wave $YVO_4$ laser is converted into harmonic by a non-linear optical element. Alternatively, the harmonic is obtained by putting a $YVO_4$ crystal and a non-linear optical element in a resonator. The harmonic is preferably shaped into oblong or elliptical laser light on an irradiation surface by an optical system and then irradiates an irradiation object. The energy density required at this point is about 0.01 to 100 MW/cm$^2$ (preferably 0.1 to 10 MW/cm$^2$). During the irradiation, the semiconductor film is moved relative to the laser light at a rate of 10 to 2000 cm/s.

Of course, although a TFT can be formed by using the silicon film having a crystallizing structure before the second harmonics of the continuous wave $YVO_4$ laser is irradiated thereon, it is preferable that the silicon film having a crystalline structure after the laser light is irradiated thereon is used to form the TFT since the silicon film irradiated the laser light thereon has an improved crystallinity and electric characteristics of TFT are improved. For instance, although, when TFT is formed by using the silicon film having a crystalline structure before the laser light is irradiated thereon, a mobility is almost 300 cm$^2$/Vs, when TFT is formed by using the silicon film having a crystalline structure after the laser light is irradiated thereon, the mobility is extremely improved with about 500 to 600 cm$^2$/Vs.

After the crystallization is conducted using nickel as a metal element that promotes crystallization of silicon, the continuous wave $YVO_4$ laser is irradiated thereon though, not limited thereof, after the silicon film is formed having an amorphous structure and the heat treatment is performed for dehydrogenation, and the silicon film having a crystalline structure may be obtained by the second harmonics of the continuous wave $YVO_4$ laser is irradiated.

The pulse wave laser may be used for as a substitute for the continuous wave laser. In the case that the excimer laser of the pulse wave is used, it is preferable that the frequency is set to 300 Hz, and the laser density is set from 100 to 1000 mJ/cm$^2$ (typically 200 to 800 mJ/cm$^2$). Here, the laser light may be overlapped 50 to 98%.

The oxide film formed by laser light irradiation is removed by diluted fluoric acid and then the surface is treated with ozone water for 120 seconds to form as a barrier layer an oxide film having a thickness of 1 to 5 nm in total. The barrier layer here is formed using ozone water but it may be formed by oxidizing the surface of the semiconductor film having a crystal structure through ultraviolet irradiation in an oxygen atmosphere, or formed by oxidizing the surface of the semiconductor film having a crystal structure through oxygen plasma treatment, or by using plasma CVD, sputtering or evaporation to form an about 1 to 10 nm thick oxide film. The oxide film formed by the laser light irradiation may be removed before the barrier layer is formed.

Next, an amorphous silicon film containing argon is formed on the barrier layer by plasma CVD or sputtering to serve as a gettering site. The thickness of the amorphous silicon film is 50 to 400 nm, here 150 nm. The amorphous silicon film is formed in an argon atmosphere with the film formation pressure to 0.3 Pa by sputtering using the silicon target.

Thereafter, heat treatment is conducted in an electric furnace at 650° C. for 3 minutes for gettering to reduce the nickel concentration in the semiconductor film having a crystal structure. Lamp annealing apparatus may be used instead of an electric furnace.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed the resist mask is removed.

The oxide film is removed by an etchant containing fluoric acid, and at the same time, the surface of the silicon film is washed. Then, an insulating film mainly containing silicon is formed to serve as a gate insulating film 803. The gate insulating film here is a silicon oxynitride film (composition ratio: Si=32%, O=59%, N=7%, H=2%) formed by plasma CVD to have a thickness of 115 nm.

Next, a laminate of a first conductive film with a thickness of 20 to 100 nm and a second conductive film with a thickness of 100 to 400 nm is formed on the gate insulating film. In this example, a tantalum nitride film with a thickness of 50 nm is formed on the gate insulating film 803 and then a tungsten film with a thickness of 370 nm is laid thereon. The conductive films are patterned by the procedure shown below to form gate electrodes and wires.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

ICP (inductively coupled plasma) etching is preferred for etching of the first conductive film and second conductive film (first etching treatment and second etching treatment). By using ICP etching and adjusting etching conditions (the amount of electric power applied to a coiled electrode, the amount of electric power applied to a substrate side electrode, the temperature of the substrate side electrode, and the like), the films can be etched and tapered as desired. The first etching treatment is conducted after a resist mask is formed. The first etching conditions include applying an RF (13.56 MHz) power of 700 W to a coiled electrode at a pressure of 1 Pa, employing $CF_4$, $Cl_2$, and $O_2$ as etching gas, and setting the gas flow rate ratio thereof to 25:25:10 (sccm). The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Thereafter, the first etching conditions are switched to the second etching conditions without removing the resist mask. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, the W film and the TaN film are etched to almost the same degree. The first etching conditions and the second etching conditions constitute the first etching treatment.

Next follows the second etching treatment with the resist mask kept in place. The third etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using $CF_4$, $Cl_2$, and $O_2$ as etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. At this stage, gate electrode 804 and wires 805 to 807 having the first conductive layer 804a as the lower layer and the second conductive layer 804b as the upper layer are formed.

Next, the resist mask is removed for the first doping treatment to dope with the entire surface using the gate electrodes 804 to 807 as masks. The first doping treatment employs ion doping or ion implantation. Here, ion doping conditions are that the dose is set to $1.5 \times 10^{14}$ atoms/cm², and the acceleration voltage is set from 60 to 100 keV. As an impurity elements that imparts the n-type conductivity, phosphorus (P) or arsenic (As) is typically used. The first impurity region ($n^{--}$ region) 822 to 825 are formed in a self-aligning manner.

Masks formed from resist are newly formed. At this moment, since the off current value of the switching TFT is lowered, the masks are formed to overlap the channel formation region of a semiconductor layer forming the switching TFT of the pixel portion 901, and a portion thereof. The masks are formed to protect the channel formation region of the semiconductor layer forming the p-channel TFT 906 of the driver circuit and the periphery thereof. In addition, the masks are formed to overlap the channel formation region of the semiconductor layer forming the current control TFT 904 of the pixel portion 901 and the periphery thereof.

An impurity region (n region) that overlaps with a portion of the gate electrode is formed by conducting selectively the second doping treatment using the masks from the resist. The second doping treatment is employs ion doping or ion implantation. Here, ion doping is used, the flow rate of gas obtained by diluting phosphine ($PH_3$) with hydrogen to 5% is set to 30 sccm, the dose is set to $1.5 \times 10^{14}$ atoms/cm², and the acceleration voltage is set to 90 keV. In this case the masks made from resist and the second conductive layer serve as masks against the impurity element that imparts the n-type conductivity and second impurity regions 311 and 312 are formed. The second impurity regions are doped with the impurity element that imparts the n-type conductivity in a concentration range of $1 \times 10^{16}$ to $1 \times 10^{17}$ atoms/cm$^3$. Here, the same concentration range as the second impurity region is referred to as a n$^-$ region.

Third doping treatment is conducted without removing the resist masks. The third doping treatment is employs ion doping or ion implantation. As impurity elements imparts n-type conductivity, phosphorus (P) or arsenic (As) are used typically. Here, ion doping is used, the flow rate of gas obtained by diluting phosphine (PH$_3$) with hydrogen to 5% is set to 40 sccm, the dose is set to $2 \times 10^{15}$ atoms/cm$^2$, and the acceleration voltage is set to 80 keV. In this case the masks made from resist and the second conductive layer serve as masks against the impurity element that imparts the n-type conductivity and third impurity regions 813, 814, 826 to 828 are formed. The third impurity regions are doped with the impurity element that imparts the n-type conductivity in a concentration range of $1 \times 10^{20}$ to $1 \times 10^{21}$ atoms/cm$^3$. Here, the same concentration range as the third impurity region is referred to as a n$^+$ region.

After removing the resist mask and the new resist mask is formed, the fourth doping treatment is conducted. The fourth impurity regions 818, 819, 832, 833 and the fifth impurity regions 816, 817, 830, 831 are formed in which impurity elements imparts p-type conductivity are added to the semiconductor layer forming the p-channel TFT by the fourth doping treatment.

The concentration of the impurity element that imparts the p-type conductivity is set from $1 \times 10^{20}$ to $1 \times 10^{21}$ atoms/cm$^3$ to add to the fourth impurity regions 818, 819, 832, and 833. The fourth impurity regions 818, 819, 832, and 833 being region (n$^{--}$ region) are already doped with phosphorus (P) in the previous step but are doped with the impurity element that imparts the p-type conductivity in a concentration 1.5 to 3 times the phosphorus concentration to obtain the p-type conductivity. Here, a region having the same concentration range as the fourth impurity regions is also called a p$^+$ region.

The fifth impurity regions 816, 817, 830, and 831 are formed in the region overlaps with the taper portion of the second conductive layer. The impurity elements imparts p-type conductivity is added thereto at the concentration range from $1 \times 10^{18}$ to $1 \times 10^{20}$ atoms/cm$^3$. Here, the region having the same concentration range as the fifth impurity regions is referred to as p$^-$ region.

Through the above steps, an impurity region having the n-type or p-type conductivity is formed in each semiconductor layer. The conductive layers 804 to 807 become the gate electrode of TFT.

An insulating is formed to cover almost the entire surface (not shown). In this example, the silicon oxide film having 50 nm in thickness is formed by plasma CVD method. Of course, the insulating film is not limited to a silicon oxide film and a single layer or laminate of other insulating films containing silicon may be used.

The next step is activation treatment of the impurity elements used to dope the semiconductor layers. The activation step employs rapid thermal annealing (RTA) using a lamp light source, irradiation of a laser, heat treatment using a furnace, or a combination of these methods.

In the example shown in this example, the interlayer insulating film is formed after the above-described activation. However, the insulating film may be formed before the activation.

The first interlayer insulating film 808 made from a silicon nitride film is formed. Then, the semiconductor layers are subjected to heat treatment (at 300 to 550° C. for 1 to 12 hours) to hydrogenate the semiconductor layers. This step is for terminating dangling bonds in the semiconductor layers using hydrogen contained in the first interlayer insulating film 808. The semiconductor layers are hydrogenated irrespective of the presence of the interlayer insulating film that is a silicon oxide film. Other hydrogenation methods employable include plasma hydrogenation (using hydrogen excited by plasma).

Next, a second interlayer insulating film 809 is formed on the first interlayer insulating film 808 from an organic insulating material. In this example, an acrylic resin film 809*a* is formed to have a thickness of 1.6 µm, and a silicon nitride film 809*b* is formed to have a thickness of 200 nm by sputtering.

The pixel electrode 834 in contact with the drain region of the current control TFT 904 formed from the p-channel TFT 904 is formed to overlap in contact with the connecting electrode that is formed later. In this example, the pixel electrode functions as an anode of OLED, and is a transparent conductive film for the light emitted from OLED radiating through the pixel electrode.

Formed next are contact holes reaching the conductive layers that serve as the gate electrodes or gate wires and contact holes reaching the impurity regions. In this example, etching treatment is conducted several times in succession. Also, in this example, the second interlayer insulating film is used as an etching stopper to etch the third interlayer insulating film, then the first interlayer insulating film is used as an etching stopper to etch the second interlayer insulating film, and then the first interlayer insulating film is etched.

Thereafter, electrodes 835 to 841, specifically, a source wire, a power supply line, a lead-out electrode, a connection electrode, etc. are formed from Al, Ti, Mo, or W. Here, the electrodes and wires are obtained by patterning a laminate of a Ti film (100 nm in thickness), an Al film containing silicon (350 nm in thickness), and another Ti film (50 nm in thickness). The source electrode, source wire, connection electrode, lead-out electrode, power supply line, and the like are thus formed as needed. A lead-out electrode for the contact with a gate wire covered with an interlayer insulating film is provided at an end of the gate wire, and other wires also have at their ends input/output terminal portions having a plurality of electrodes for connecting to external circuits and external power supplies. The connection electrode 841 provided as to contact and overlap with the pixel electrode 834 that is previously formed is in contact with the drain region of the current control TFT 904.

A driving circuit 902 having a CMOS circuit in which an n-channel TFT 905 and a p-channel TFT 906 are combined complementarily and a pixel portion 901 with a plurality of pixels each having an n-channel TFT 903 or a p-channel TFT 904 are formed in the manner described above.

Next, insulators 842*a* and 843*b* referred to as a bank are formed on each end of the pixel electrode 834 so as to cover each end of the pixel electrode 834. The banks 842*a* and 843*b* are formed from an insulating film containing silicon or a resin film. In this example, the bank 842*a* is formed by patterning the insulating film made from the organic resin film, the silicon nitride film is formed by sputtering, and the bank 842*b* is formed by patterning.

Next, an EL layer 843 and the cathode 844 of OLED are formed on the pixel electrode 834 whose ends are covered by the banks. In this example, the EL layer 843 and the cathode 844 of OLED are evaporated by the deposition apparatus shown in Embodiment 1. An evaporation method is according to Embodiment 1 or Example 1. High-density and high purity EL layer may be formed by conducting evaporation in vacuum while heating the substrate.

An EL layer 843 (a layer for light emission and for moving of carriers to cause light emission) has a light emitting layer and a free combination of electric charge transporting layers and electric charge injection layers. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

It is said that the preferred material of a cathode 844 is a metal having a small work function (typically, a metal element belonging to Group 1 or 2 in the periodic table) or an alloy of such metal. The light emission efficiency is improved as the work function becomes smaller. Therefore, an alloy material containing Li (lithium) that is one of alkali metals is particularly desirable as the cathode material. The cathode also functions as a wire common to all pixels and has a terminal electrode in an input terminal portion through a connection wire.

The stage completed so far steps is shown in FIG. 8. Though the switching TFT 903 and the current supply TFT for OLED (the current control TFT) are shown in FIG. 8, it goes without saying that it is not limited thereof, various circuits formed from plural TFTs may be provided at the end of the gate electrode of TFT.

Next, the OLED having at least a cathode, an organic compound layer, and an anode is preferably sealed by an organic resin, a protective film, a sealing substrate, or a sealing can to cut the OLED completely off from the outside and prevent permeation of external substances, such as moisture and oxygen, that accelerate degradation due to oxidization of the EL layer. However, it is not necessary to provide the protective film or the like in the input/output terminal portions to which an FPC needs to be connected later.

The FPC (flexible printed circuit) is attached to the electrodes of the input/output terminal portions using an anisotropic conductive material. The anisotropic conductive material is composed of a resin and conductive particles several tens to several hundreds μm in diameter whose surfaces are plated by Au or the like. The conductive particles electrically connect the electrodes of the input/output terminal portions with wires formed in the FPC.

If necessary, an optical film such as a circularly polarizing plate composed of a polarizing plate and a phase difference plate may be provided and an IC chip may be mounted.

Through the above steps, a module type light emitting device to which an FPC is connected is completed.

This example may be freely combined with Embodiments 1, 2, and Examples 1 to 4.

Example 6

The top surface view and the cross-sectional view of the module type light emitting device (also referred to as EL module) obtained by Example 5 are shown.

Figure 9A:
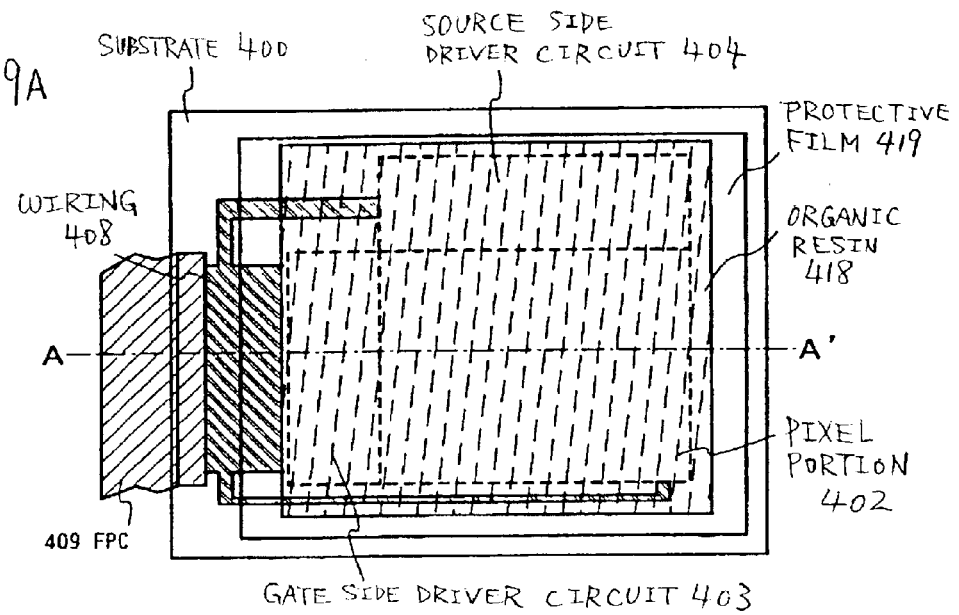
FIGS. 9A and 9B show figures illustrating a light emitting apparatus of the invention.
Figure 9B:
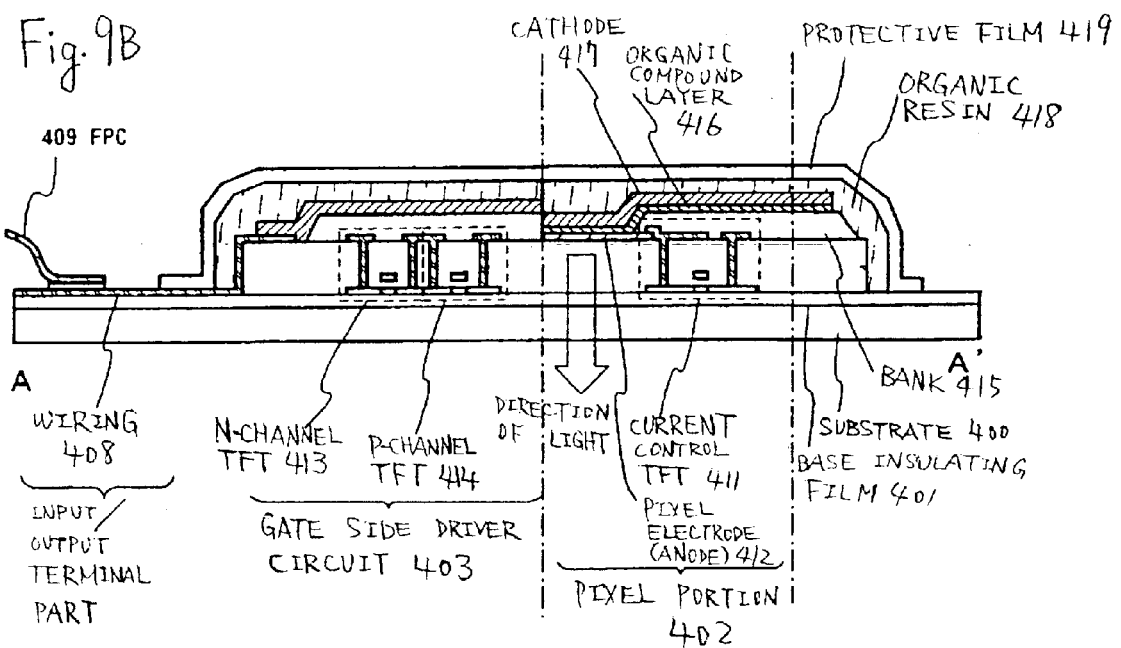

FIG. 9A is a view of a top surface view of EL module and FIG. 9B is a cross-sectional view taken along the line of A–A' of FIG. 9A. FIG. 9A shows that the base insulating film 401 is formed on the bonding member 400 (for example, the second bonding member and the like), and the pixel portion 402, the source side driver circuit 404, and the gate side driver circuit 403 are formed thereon. These pixel portion and driver circuit may be obtained according to above-mentioned Example 5.

The reference numeral 418 is an organic resin and 419 is a protective film. The pixel portion and the driver circuit portion are covered by the organic resin 418, and the organic resin 418 is covered by the protective film 419. In addition, the organic resin may be sealed by the cover material using the bonding member. The cover material can be adhered as a support medium before peeling-off is subjected. In addition, reference numeral 408 represents a wiring for transmitting signals to be inputted into the source side driving circuit 404 and the gate side driving circuit 403, and it receives a video signal and a clock signal from the FPC (flexible print circuit) 409 which becomes an external input terminal. In addition, here, only FPC is shown in the figure, but a printed wiring board (PWB) may be attached to this FPC. A light emitting device in the present specification is assumed to contain not only a light emitting device itself but also a state in which FPC or PWB is attached thereto.

The cross-sectional structure shown in FIG. 9B is described. A base insulating film 401 is formed on the bonding member 400. The pixel portion 402 and the gate driving circuit 403 are formed in contact with the insulating film 401. The pixel portion 402 is composed of the current control TFT 411 and plural pixels including the pixel electrode 412 that is connected electrically to the drain of the current control TFT 411. In addition, the gate driving circuit 403 is formed by using a CMOS circuit that is combined with the n-channel TFT 413 and the p-channel TFT 414.

The TFTs (including 411, 413, and 414) may be manufactured according to n-channel TFT of Example 5 and p-channel TFT of Example 5. Though only the current supply TFT for OLED (the current control TFT 411) is shown in FIG. 9, it goes without saying that it is not limited thereof, various circuits formed from plural TFTs may be provided at the end of the gate electrode of TFT.

The pixel portion 402, the source side driver circuit 404, and the gate side driver circuit 403 are formed on the same substrate according to Example 5.

The pixel electrode 412 functions as a cathode of the light emitting element (OLED). The bank 415 is formed at the both ends portion of the pixel electrode 412. The organic compound layer 416 and the anode 417 of the light emitting element are formed on the pixel electrode 412.

As the organic compound layer 416, it should be appreciated that the organic compound layer (a layer for carrying out light emission and movement of carriers therefore) may be formed by freely combining a light emitting layer, an electric charge transport layer or an electric charge injection layer.

The anode 417 functions as a common wiring to all pixels, and is electrically connected to an FPC 409 through a connection wiring 408. Further, elements which are contained in the pixel portion 402 and the gate side driving circuit 403 are all covered by the anode 417, an organic resin 418 and a protective film 419.

In addition, as the organic resin 418, it is preferable to use a transparent or half transparent material to visible light to the extent possible. Further, it is preferable that the organic resin 418 is a material which does not transmit impurities such as moisture and oxygen to the extent possible.

Also, it is preferred that after the light emitting element has been completely covered with the organic resin 418, the protective film 419 be at least formed on the surface (exposed surface) of the organic resin 418 as shown in FIGS. 7A and 7B. The protective film may be formed on the entire surface including the back surface of the substrate. In such a case, it is necessary to carefully form the protective film so that no protective film portion is formed at the position where the external input terminal (FPC) is provided. A mask may be used to prevent film forming of the protective film at this position. The external input terminal portion may be covered with a tape such as a tape made of Teflon (registered trademark) used as a masking tape in a CVD apparatus to prevent film forming of the protective film. The silicon nitride film, the DLC film, or AlNxOy film may be used as the protective film 419.

The light emitting element constructed as described above is enclosed with the protective film 419 to completely isolate the light emitting element from the outside, thus preventing materials such as water and oxygen which accelerate degradation of the organic compound layer by oxidation from entering from the outside. Thus, the light emitting device having improved reliability is obtained. The steps from the deposition to the sealing of EL layer may be conducted by using the apparatus shown in FIGS. 5 to 7.

Figure 10:
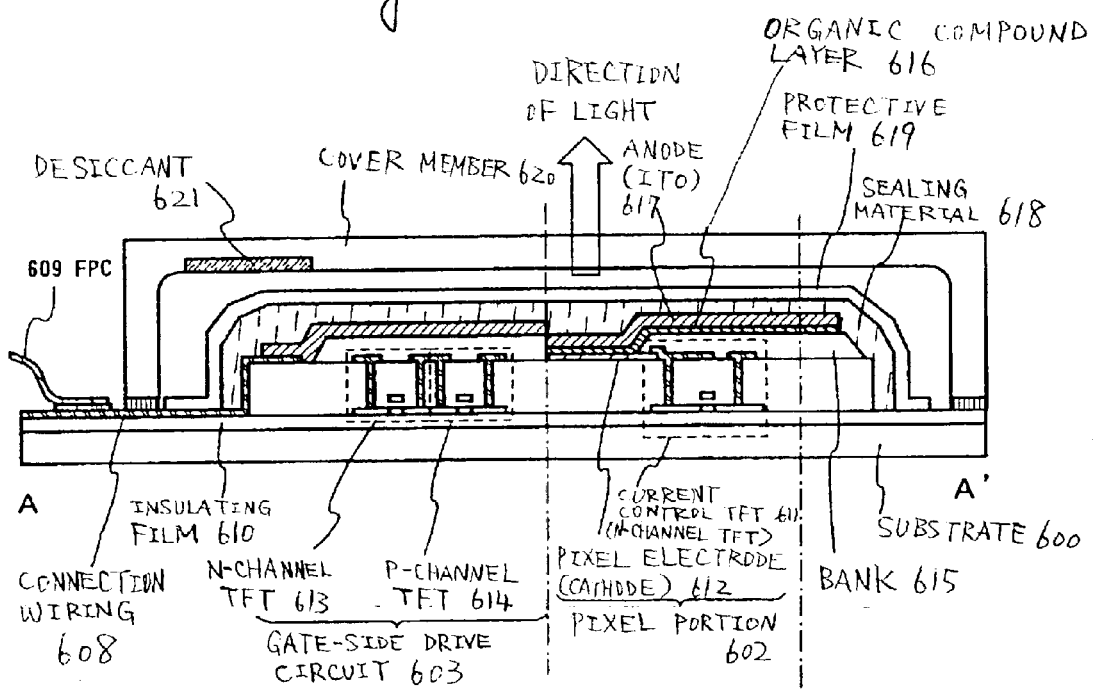
FIG. 10 shows a figure illustrating a light emitting apparatus of the invention.

Another arrangement is conceivable in which a pixel electrode is used as an anode and an organic compound layer and a cathode are made in lamination to emit light in a direction opposite to the direction indicated in FIG. 9. FIG. 10 shows an example of such an arrangement. The top view thereof is the same as the top view shown in FIG. 9 and will therefore be omitted.

The structure shown in the cross-sectional view of FIG. 7 will be described. An insulating film 610 is formed on a substrate 600, and a pixel portion 602 and a gate-side drive circuit 603 are formed above the insulating film 610. The pixel portion 602 is formed by a plurality of pixels including a current control TFT 611 and a pixel electrode 612 electrically connected to the drain of the current control TFT 611. A gate side driver circuit 603 is formed by using a CMOS circuit having a combination of an n-channel TET 613 and a p-channel TFT 614.

These TFTs (611, 613, 614, etc.) may be fabricated in the same manner as the n-channel TFT of Example 5 and the p-channel TFT of Example 5. Though only the current supply TFT for OLED (the current control TFT 411) is shown in FIG. 10, it goes without saying that it is not limited thereof, various circuits formed from plural TFTs may be provided at the end of the gate electrode of TFT.

The pixel electrode 612 functions as an anode of the light emitting element (OLED). Banks 615 are formed at opposite ends of the pixel electrode 612, and an organic compound layer 616 and an anode 617 of the light emitting element are formed over the pixel electrode 612.

The anode 617 also functions as a common wiring element connected to all the pixels and is electrically connected to a FPC 609 via connection wiring 608. All the elements included in the pixel portion 602 and the gate-side drive circuit 603 are covered with the anode 617, an organic resin 618 and a protective film 619. A cover member 620 is bonded to the element layer by an adhesive. A recess is formed in the cover member and a desiccant 621 is set therein.

In the arrangement shown in FIG. 10, the pixel electrode is used as the cathode while the organic compound layer and the anode are formed in lamination, so that light is emitted in the direction of the arrow in FIG. 10.

While the top gate TFTs have been described by way of example, the present invention can be applied irrespective of the TFT structure. For example, the present invention can be applied to bottom gate (inversely staggered structure) TFTs and staggered structure TFTs.

This example may be freely combined with Embodiments 1, 2, and Examples 1 to 5.

Example 7

By implementing the present invention, EL modules (active matrix liquid crystal module, active matrix EL module and active matrix EC module) can be completed. Namely, by implementing the present invention, all of the electronic equipments into which the various modules are built are completed. Following can be given as such electronic equipments: video cameras; digital cameras; head mounted displays (goggle type displays); car navigation systems; car stereos; personal computers; portable information terminals (mobile computers, mobile phones or electronic books etc.) etc. Examples of these are shown in FIGS. 11 and 12. FIG. 11A is a personal computer which comprises: a main body 2001; an image input section 2002; a display section 2003; and a keyboard 2004 etc.

FIG. 11B is a video camera which comprises: a main body 2101; a display section 2102; a voice input section 2103; operation switches 2104; a battery 2105 and an image receiving section 2106 etc.

FIG. 11C is a mobile computer which comprises: a main body 2201; a camera section 2202; an image receiving section 2203; operation switches 2204 and a display section 2205 etc. FIG. 11D is a goggle type display which comprises: a main body 2301; a display section 2302; and an arm section 2303 etc. FIG. 11E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet. FIG. 11F is a digital camera which comprises: a main body 2501; a display section 2502; a view finder 2503; operation switches 2504; and an image receiving section (not shown in the figure) etc.

Figure 12A:
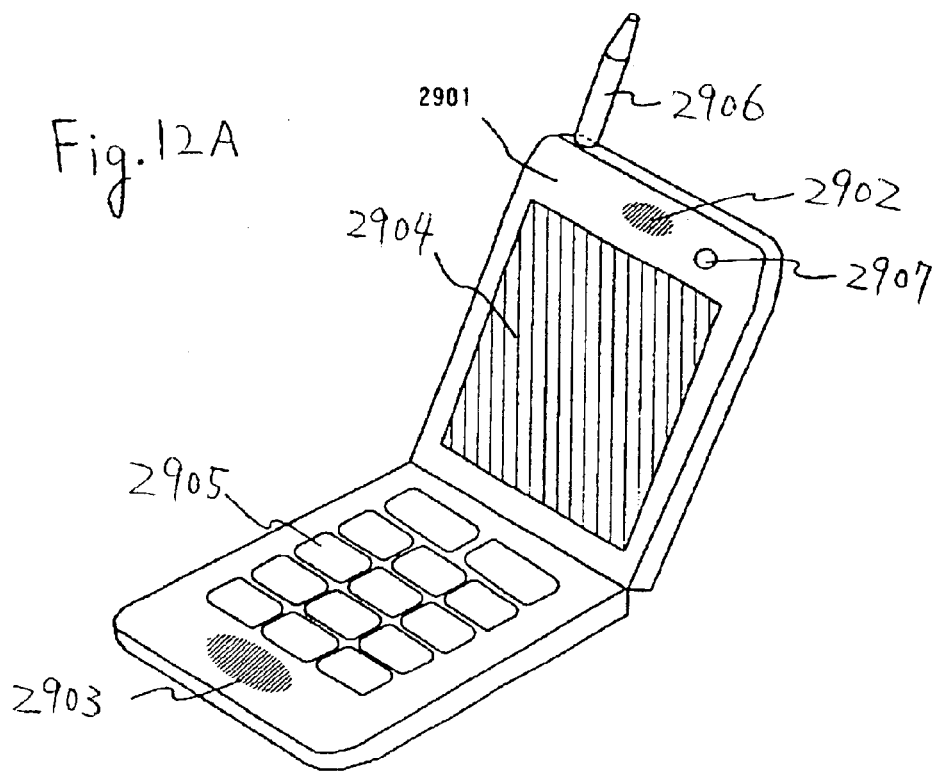
FIGS. 12A to 12C show figures illustrating one example of an electronic apparatus.

FIG. 12A is a mobile phone which comprises: a main body 2901; a voice output section 2902; a voice input section 2903; a display portion 2904; operation switches 2905; an antenna 2906; and an image input section (CCD, image sensor, etc.) 2907 etc.

Figure 12B:
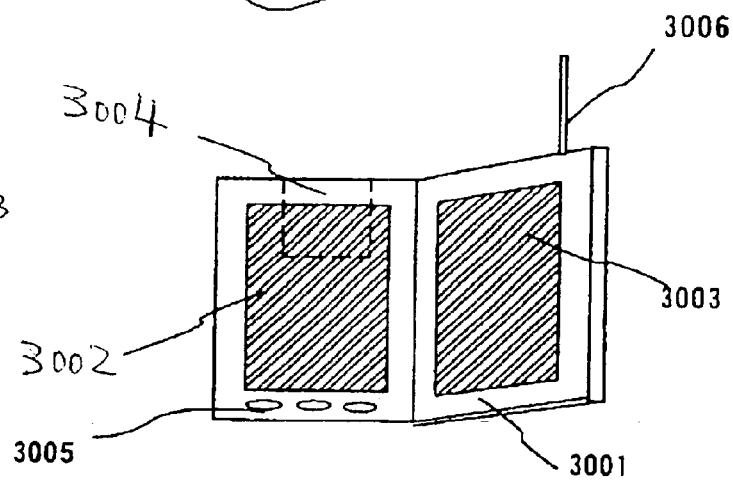

FIG. 12B is a portable book (electronic book) which comprises: a main body 3001; display portions 3002 and 3003; a recording medium 3004; operation switches 3005 and an antenna 3006 etc.

Figure 12C:
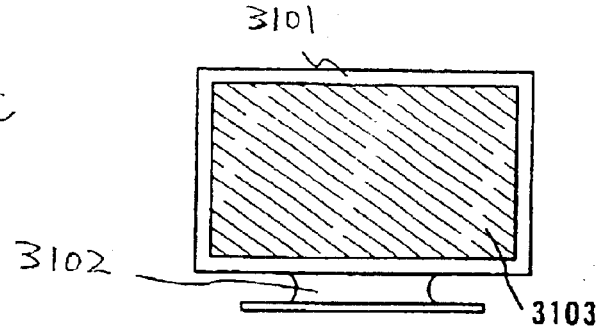

FIG. 12C is a display which comprises: a main body 3101; a supporting section 3102; and a display portion 3103 etc. In addition, the display shown in FIG. 12C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electronic equipments of various areas. Note that the electronic devices of this example can be achieved by utilizing any combination of constitutions in Embodiments 1 to 3, and Examples 1 to 6.

Example 8

In the present example, a novel film formation method is described.

As a typical example of a physical film formation method, a vacuum evaporation which forms a film by evaporating an evaporating material from an evaporation source under vacuum is known. Further, as a typical example of chemical film formation method, CVD (chemical vapor deposition) which forms a film by chemical reaction on a substrate surface or in a vapor is known.

The present example provides a novel film formation method. That is, when an organic compound material is evaporated from an evaporation source in a film formation chamber, a minute amount of a material gas which comprises, as an ingredient, a material which is smaller than a particle of the organic compound material is made flow to include the small atomic radius material in an organic compound film.

As the small atomic radius material gas, one kind or a plural kinds selected from a silane group gas (monosilane, disilane and trisilane), $SiF_4$, $GeH_4$, $GeF_4$, $SnH_4$ and hydrocarbon group gas ($CH_4$, $C_2H_2$, $C_2H_4$ and $C_6H_6$) can be used. Before the gas is introduced inside the apparatus, the gas is highly purified by a gas purifying machine. Accordingly, it is necessary to provide the gas purifying machine so that after the gas is highly purified, the gas is introduced into the evaporation apparatus. Thereby, oxygen, water and other impurities contained in a gas can be previously removed. Therefore, it is possible to prevent these impurities from being introduced inside the apparatus.

For example, when a monosilane gas is introduced at several sccm into the film formation chamber in which an organic material is deposited by evaporation, $SiH_4$ floating inside the film formation chamber enters into a thin film which is formed over a substrate by depositing an organic material evaporated from the evaporation source. Then, a small atomic radius $SiH_4$ as it is or $SiH_x$ is buried between relatively large particle radius organic material molecules to be contained in the film. During evaporation, the evaporation source is heated at about 100° C. Because monosilane has a decomposition temperature of about 550° C., it does not decompose. Depending on an organic material to be evaporated, it reacts with $SiH_4$ or $SiH_x$ to form a compound. Further, because oxygen (or moisture) slightly remaining in the film formation chamber is captured to form $SiO_x$, oxygen (or moisture) which is a factor deteriorating an organic material can be reduced in the film formation chamber and in the film. As a result, it is possible to improve reliability of a light emitting element.

When there is a spacing between the organic material molecules in the film, oxygen easily enters the spacing to cause deterioration. Because this spacing should be buried, reliability of the light emitting element can be improved by using $SiF_4$, $GeH_4$, $GeF_4$, $SnH_4$ and hydrocarbon group gas ($CH_4$, $C_2H_2$, $C_2H_4$ and $C_6H_6$).

As the above organic material, α-NPD (4,4'-bis-[N-(naphthyl)-N-phenyl-amino]biphenyl), BCP (basocuproine), MTDATA (4,4',4"-tris(N-3-methylphenyl-N-phenyl-amino) triphenylamine), $Alq_3$ (tris-8-quinolinorathoaluminum derivative) can be enumerated.

The present example is effective when forming a mixed region shown in FIG. 4 by coevaporation, or when depositing a functional region (having an electron transporting function). As a result, reliability of a light emitting element is improved.

A vacuum degree of the film formation chamber is $10^{-8}$ to $10^{-1}$ Torr, preferably $10^{-7}$ to $10^{-2}$ Torr. A dry pump, a cryopump, or a turbo molecular pump of magnetic float type is provided for a vacuum evaporation treatment chamber connected with the film formation chamber. Further, when a surface of a material of an inner wall of the film formation chamber is made small, adsorption of impurities such as oxygen and water can be made small. Therefore, stainless steel (SUS) or aluminum mirrored by electrolytic polishing is used. Thereby, it is possible to maintain a vacuum degree of $10^{-8}$ to $10^{-1}$ Torr inside the film formation chamber. Further, a material such as ceramics treated to reduce a pore to extremely small number is used for an inner member. It is to be noted that it is preferred that these have surface flatness having a center line average flatness of 3 nm or less.

Figure 15:
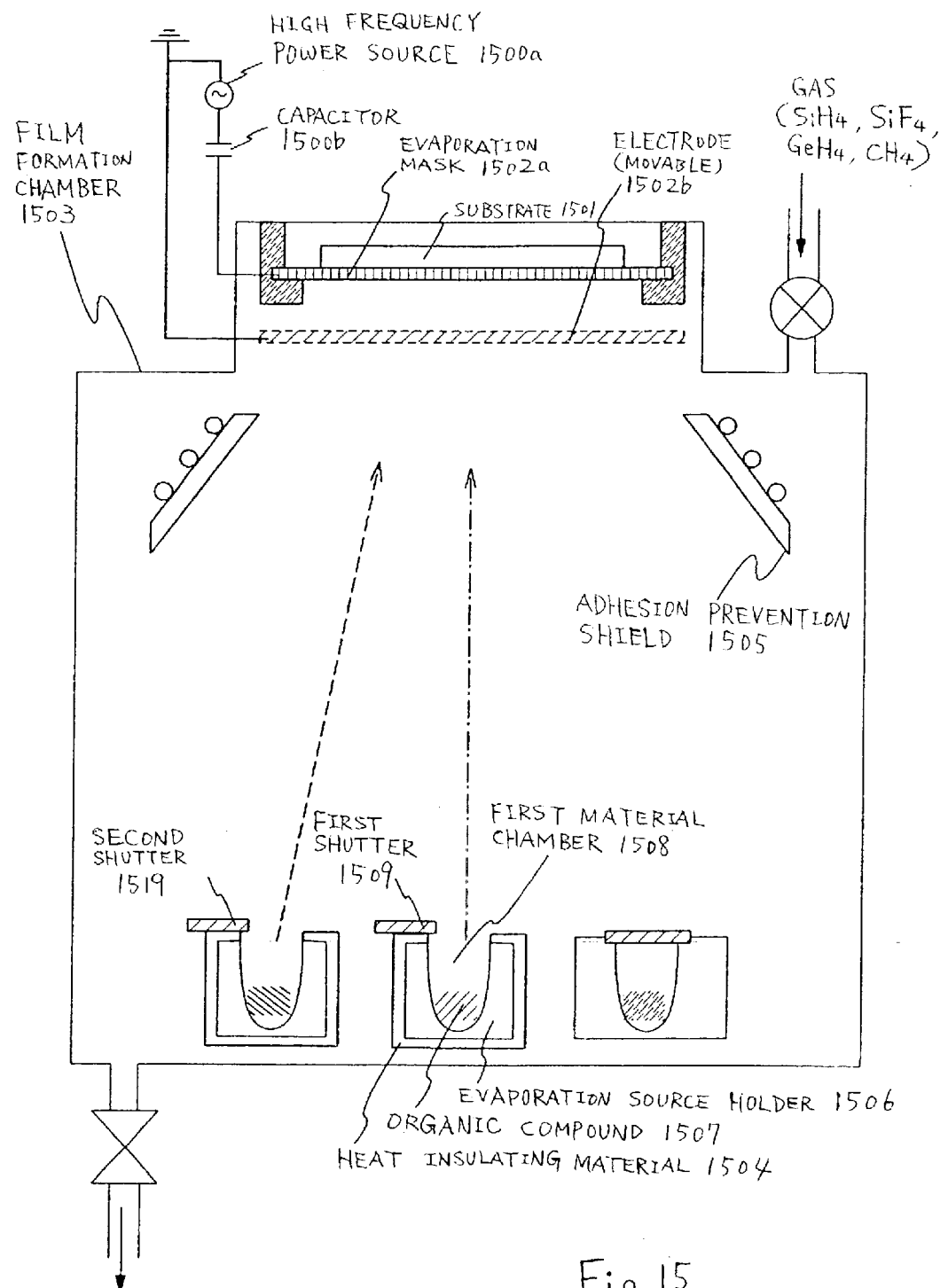
FIG. 15 shows an example of a film formation apparatus (Example 8).

A constitution of a film formation apparatus in the present invention will be explained using FIG. 15. FIG. 15 shows an example showing a cross sectional view of the film formation apparatus in the present invention.

In FIG. 15, an evaporation mask 1502a fixed in contact with a substrate 1501 by a holder is provided. Further, under it, evaporation source holders 1506 being capable of being heated at different temperatures respectively are provided. It is to be noted that these evaporation sources are provided opposed to the substrate.

A material chamber 1508 is a space of the evaporation holders 1506 comprising a conductive metal material. When an organic compound 1507 provided inside is heated to a sublimation temperature by a heating means (typically a resistance heating method) provided for the evaporation holders, it is deposited over a surface of the substrate through vaporization. It is to be noted that when conducting the evaporation, an electrode 1502b is moved to a position where it does not prevent the evaporation. Further, the organic compound 1507 is provided in respective containers (typically crucible and evaporation boat).

Further, during the evaporation, a material gas is introduced at several sccm to contain the material gas in the film. The material gas or main ingredient of the material gas is contained in the film at 0.01 atoms % to 5 atoms %, preferably 0.1 atoms % to 2 atoms %. As a gas introduced into the film formation chamber 1503, one kind or a plural kinds selected from a silane group gas (monosilane, disilane and trisilane), $SiF_4$, $GeH_4$, $GeF_4$, $SnH_4$ and hydrocarbon group gas ($CH_4$, $C_2H_2$, $C_2H_4$ and $C_6H_6$) can be used.

The film containing an organic compound formed using FIG. 15 contains the material gas or the main ingredient of the material gas, and oxygen and moisture are hard to enter the film. Therefore, a light emitting element using this film containing the organic compound is improved in reliability.

Further, when conducting coevaporation by evaporating a plurality of different materials, two kinds of organic compounds are simultaneously evaporated and the above material gas is introduced to form a mixed region containing the two kinds of organic compounds and the material gas or the main ingredient of the material gas.

Further, after evaporating the first organic compound, the second organic compound is evaporated under the same evaporation atmosphere and the above material gas is introduced to form a mixed region between the first functional region and the second functional region. In the present example, the first organic compound is vaporized by previous resistance heating and the first shutter 1509 is opened during the evaporation. Thereby, it is dispersed toward the substrate. In this way, the first functional region shown in FIG. 4A can be formed. Next, the second shutter 1519 is opened for the evaporation to form a mixed region.

Further, in forming the mixed region, the mixed region may have concentration gradient. Further, the present invention is applicable when a material capable of converting a triplet excitation energy into a light emission is added to the mixed region as a dopant. Further, when conducting coevaporation, it is preferred that directions of evaporating organic compounds are crossed at a position of an object to be evaporated so that the organic compounds are mixed with each other.

Further, an adhesion prevention shield 1505 is provided to prevent an organic compound from adhering to an inner wall of the film formation chamber during the evaporation.

Further, because the evaporation holder 1506 provided with heating means such as a heater is raised to a high temperature, it is preferred that it is covered with a heat insulating material 1504.

Further, plasma may be generated provided that it does not impart damage to the film containing organic compound. It is possible to generate plasma between the evaporation mask 1502a connected with a high frequency power source 1500a through a capacitor 1500b and an electrode 1502b.

Further, phosphine gas may be introduced in addition to monosilane. Further, instead of monosilane, $AsH_3$, $B_2H_2$, $BF_4$, $H_2Te$, $Cd(CH_3)_2$, $Zn(CH_3)_2$, $(CH_3)_3In$, $H_2Se$, $BeH_2$, trimethyl gallium or triethyl gallium can be used.

The present example can be freely combined with either one of Embodiments 1 to 3 and Examples 1 to 7.

According to the invention, while a substrate being heated in vacuum, deposition is carried out and film with a desired thickness is formed, so that an organic compound layer with a high density and a high purity can be formed.

Further, according to the invention, while a substrate being heated in vacuum, deposition is carried out a plurality of times, so that molecules between respectively neighboring layers are fitted better. Especially, in the case of forming mixed regions, the molecules in the mixed regions are fitted better. Consequently, the driving voltage can be decreased further and the brightness deterioration can be suppressed.

Further, according to the invention, in a single film formation chamber, it is made possible to carry out annealing in vacuum before film formation, annealing in vacuum during film formation, and annealing in vacuum after film formation to result in improvement of the throughput.

Further, according to the invention, deposition materials adhering to jigs installed in the inside of the film formation apparatus and inner wall of the film formation apparatus can be removed without exposing them to the atmospheric air.

What is claimed is:

1. A film formation apparatus for forming a film over a substrate by depositing an organic compound material from a deposition source provided opposite to the substrate, said film formation apparatus comprising:
   a film formation chamber to provide said substrate therein;
   a deposition source provided in said film formation chamber;
   a means provided in said film formation chamber for heating the deposition source;
   a heating means provided in said film formation chamber for heating a mask; and
   a vacuum gas discharge treatment chamber for vacuum evaluating the film formation chamber,
   wherein the film formation chamber is connected with the vacuum gas discharge treatment chamber.

2. An apparatus according to claim 1, wherein said film formation chamber is kept in vacuum degree of $1\times10^{-3}$ Torr or lower pressure.

3. An apparatus according to claim 1 wherein a plurality of deposition sources are provided and contain organic compounds respectively having different functions and at least two types of the organic compounds are simultaneously deposited.

4. An apparatus according to claim 1 wherein the temperature $T_1$ of said substrate is controlled to be lower than the temperature $T_3$ of said deposition source.

5. An apparatus according to claim 1 wherein the temperature $T_1$ of said substrate is controlled to be in a range from 50° C. to 200° C.

6. A film formation apparatus for forming a film over a substrate by depositing an organic compound material from a deposition source provided opposite to the substrate, said film formation apparatus comprising;
   a film formation chamber to provide said substrate therein,
   an adhesion prevention means provided in said film formation chamber for preventing film formation in the inner wall;
   a heating means provided in said film formation chamber for heating the adhesion prevention means;
   the deposition source provided in said film formation chamber,
   a means provided in said film formation chamber for heating the deposition source; and
   a heating means provided in said film formation chamber for heating a mask; and
   a vacuum gas discharge treatment chamber for vacuum evacuating the film formation chamber,
   wherein the film formation chamber is connected with said vacuum gas discharge treatment chamber.

7. An apparatus according to claim 6, wherein said film formation chamber is kept in vacuum degree of $1\times10^{-3}$ Torr or lower pressure.

8. An apparatus according to claim 6 wherein a plurality of deposition sources are provided and contain organic compounds respectively having different functions and at least two types of the organic compounds are simultaneously deposited.

9. An apparatus according to claim 6 wherein the temperature $T_1$ of said substrate is controlled to be lower than the temperature $T_3$ of said deposition source.

10. An apparatus according to claim 6 wherein the temperature $T_1$ of said substrate is controlled to be in a range from 50° C. to 200° C.

11. An apparatus according to claim 6 wherein the temperature $T_1$ of said substrate is controlled to be lower than the temperature $T_2$ of said adhesion prevention means by at least 10° C. and the temperature $T_2$ of said adhesion prevention means is controlled to be lower than the temperature $T_3$ of said deposition source.

12. A film formation apparatus comprising:
   a load chamber,
   a transportation chamber, and
   a film formation chamber joined to each other in series,
   wherein said film formation chamber has a function of conforming the positioning of a mask and a substrate and said film formation chamber is connected with a vacuum gas discharge treatment chamber for vacuum evacuating the film formation chamber and comprises an adhesion prevention means for preventing film formation in the inner wall, a heating means for heating the adhesion prevention means, the deposition source, a means for heating the deposition source, and a heating means for heating a mask.

13. An apparatus according to claim 12, wherein said film formation chamber is kept in vacuum degree of $1 \times 10^{-3}$ Torr or lower pressure.

14. An apparatus according to claim 12 wherein a plurality of deposition sources are provided and contain organic compounds respectively having different functions and at least two types of the organic compounds are simultaneously deposited.

15. An apparatus according to claim 12 wherein the temperature $T_1$ of said substrate is controlled to be lower than the temperature $T_3$ of said deposition source.

16. An apparatus according to claim 12 wherein the temperature $T_1$ of said substrate is controlled to be in a range from 50° C. to 200° C.

17. An apparatus according to claim 12 wherein the temperature $T_1$ of said substrate is controlled to be lower than the temperature $T_2$ of said adhesion prevention means by at least 10° C. and the temperature $T_2$ of said adhesion prevention means is controlled to be lower than the temperature $T_3$ of said deposition source.

18. A film formation apparatus comprising:
a load chamber;
a transportation chamber connected with said load chamber; and
a film formation chamber connected with said transportation chamber,
wherein said transportation chamber has a function of conforming the positioning of a mask and a substrate and said film formation chamber is connected with a vacuum gas discharge treatment chamber for vacuum evacuating the film formation chamber and said film formation chamber comprises an adhesion prevention means for preventing film formation in the inner wall, a heating means for heating the adhesion prevention means, the deposition source, a means for heating the deposition source, and a heating means for heating a mask.

19. An apparatus according to claim 18, wherein said film formation chamber is kept in vacuum degree of $1 \times 10^{-3}$ Torr or lower pressure.

20. An apparatus according to claim 18 wherein a plurality of deposition sources are provided and contain organic compounds respectively having different functions and at least two types of the organic compounds are simultaneously deposited.

21. An apparatus according to claim 18 wherein the temperature $T_1$ of said substrate is controlled to be lower than the temperature $T_3$ of said deposition source.

22. An apparatus according to claim 18 wherein the temperature $T_1$ of said substrate is controlled to be in a range from 50° C. to 200° C.

23. An apparatus according to claim 18 wherein the temperature $T_1$ of said substrate is controlled to be lower than the temperature $T_2$ of said adhesion prevention means by at least 10° C. and the temperature $T_2$ of said adhesion prevention means is controlled to be lower than the temperature $T_3$ of said deposition source.

24. A film formation apparatus for forming a film over a substrate by depositing an organic compound material from a deposition source provided opposite to the substrate, said film formation apparatus comprising:
a film formation chamber to provide said substrate therein,
a deposition source provided in said film formation chamber;
a means provided in said film formation chamber for heating the deposition source;
a heating means provided in said film formation chamber for heating a substrate;
a mask provided in said film formation chamber, and
an electrode provided in said film formation chamber and opposite to the mask; and
a vacuum gas discharge treatment chamber for vacuum evacuating the film formation chamber,
wherein the film formation chamber is connected with the vacuum gas discharge treatment chamber and plasma is generated in the film formation chamber.

25. An apparatus according to claim 10; wherein said mask is made of a conductive material and either one of said mask and said electrode is connected with a high frequency power source.

26. A film formation apparatus for forming a film over a substrate by depositing an organic compound material from a deposition source provided opposite to the substrate, said film formation apparatus comprising:
a film formation chamber to provide said substrate therein;
a deposition source provided in said film formation chamber;
a means provided in said film formation chamber for heating the deposition source;
a heating means provided in said film formation chamber for heating a substrate; and
a vacuum gas discharge treatment chamber for vacuum evacuating the film formation chamber,
wherein the film formation chamber is connected with the vacuum gas discharge treatment chamber and also with a cleaning preparatory chamber for radiating laser beam to the inner wall of said treatment chamber.

27. An apparatus according to claim 26; wherein said laser beam is scanned by using a galvano-mirror.

* * * * *